US006927420B2

(12) United States Patent
Kim

(10) Patent No.: US 6,927,420 B2
(45) Date of Patent: Aug. 9, 2005

(54) THIN FILM TRANSISTOR ARRAY PANEL AND MANUFACTURING METHOD THEREOF

(75) Inventor: Dong-Gyu Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/648,544

(22) Filed: Aug. 26, 2003

(65) Prior Publication Data

US 2004/0113149 A1 Jun. 17, 2004

(30) Foreign Application Priority Data

Aug. 27, 2002 (KR) .................................. 10-2002-0050778

(51) Int. Cl.$^7$ ............................................. H01L 29/04
(52) U.S. Cl. ...................... 257/72; 257/59; 257/173; 257/355; 257/360; 257/536; 349/139; 349/140; 349/149; 349/152; 349/40; 349/192
(58) Field of Search ........................... 257/72, 59, 173, 257/355, 360, 363, 536, 537; 349/139, 140, 149, 152, 40, 192

(56) References Cited

U.S. PATENT DOCUMENTS

| 5,459,410 A | * | 10/1995 | Henley ........................ 324/770 |
| 6,013,923 A | * | 1/2000 | Huang .......................... 257/59 |
| 6,337,722 B1 | * | 1/2002 | Ha ............................... 349/40 |
| 6,392,719 B2 | * | 5/2002 | Kim .............................. 349/40 |
| 6,420,785 B2 | * | 7/2002 | Song et al. .................. 257/758 |
| 6,613,650 B1 | * | 9/2003 | Holmberg .................... 438/438 |

* cited by examiner

Primary Examiner—Nathan J. Flynn
Assistant Examiner—Remmon R. Fordé
(74) Attorney, Agent, or Firm—Cantor Colburn LLP

(57) ABSTRACT

Gate lines and a gate shorting bar connected to the gate lines, which include lower and upper films, are formed on a substrate. A gate insulating layer, semiconductors, and ohmic contacts are formed in sequence. Data lines and a data shorting bar connected to the data lines, which include lower and upper films, are formed thereon. A passivation layer is formed on the data lines and the data shorting bar. The passivation layer and the gate insulating are patterned to form contact holes exposing the lower films of the gate lines and the data lines. Connecting portions of the gate lines and the data lines for connection with driving circuits are locate opposite the shorting bars with respect to the contact holes.

12 Claims, 44 Drawing Sheets

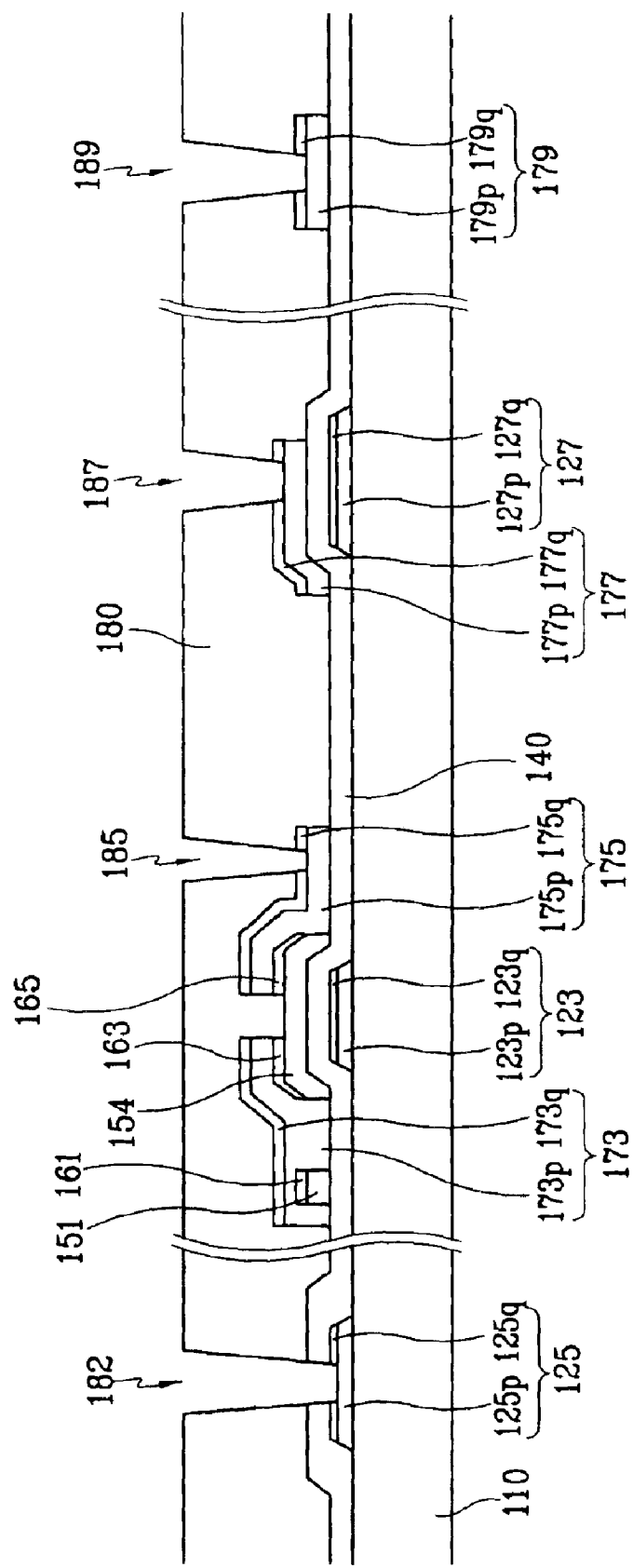

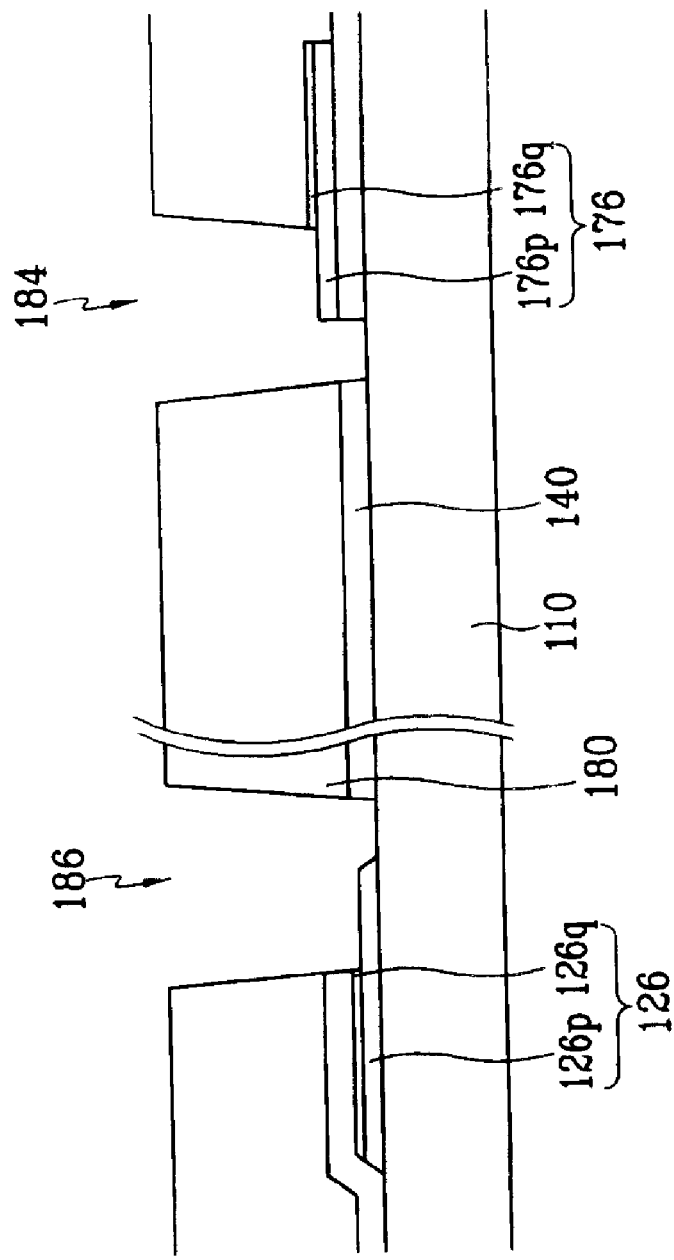

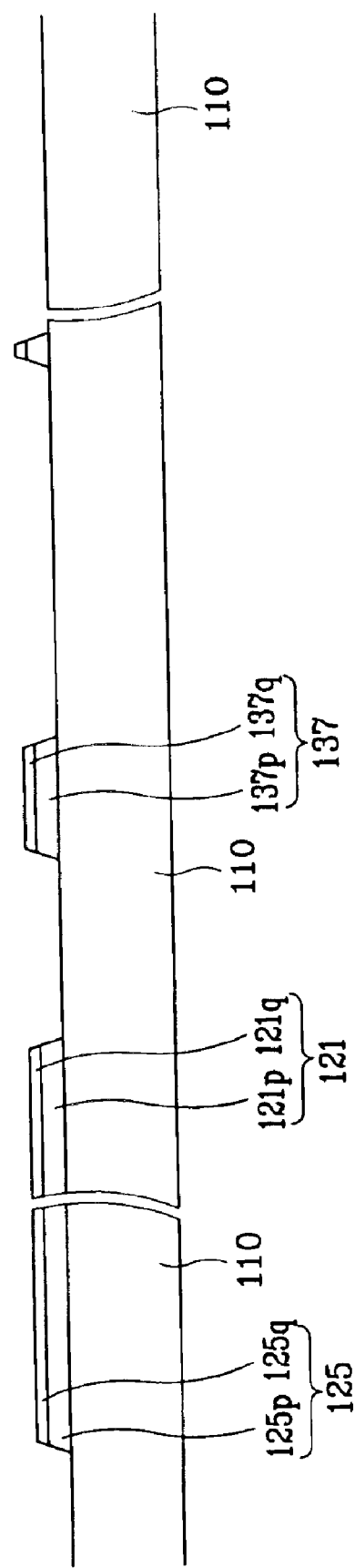

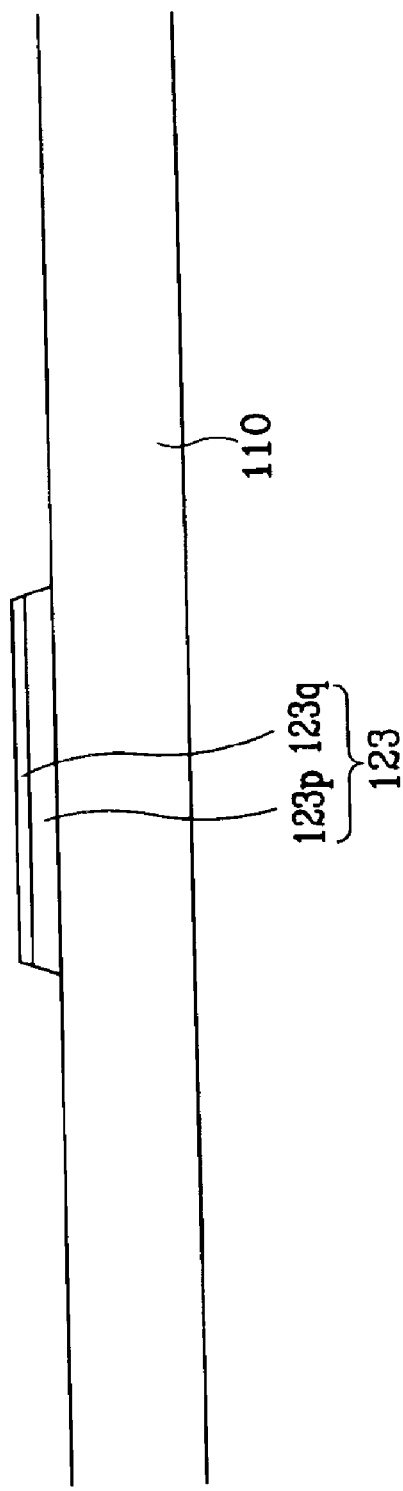

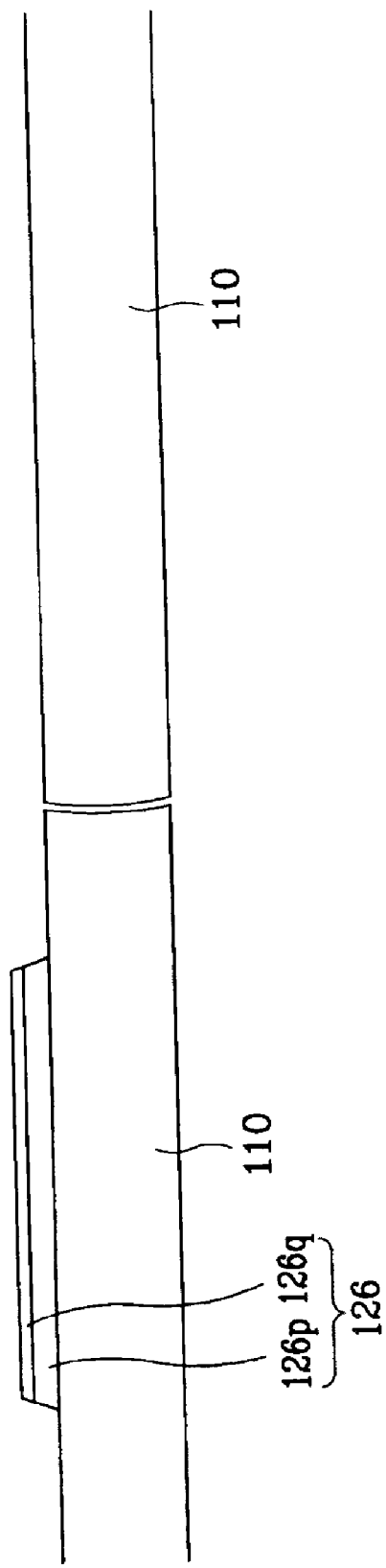

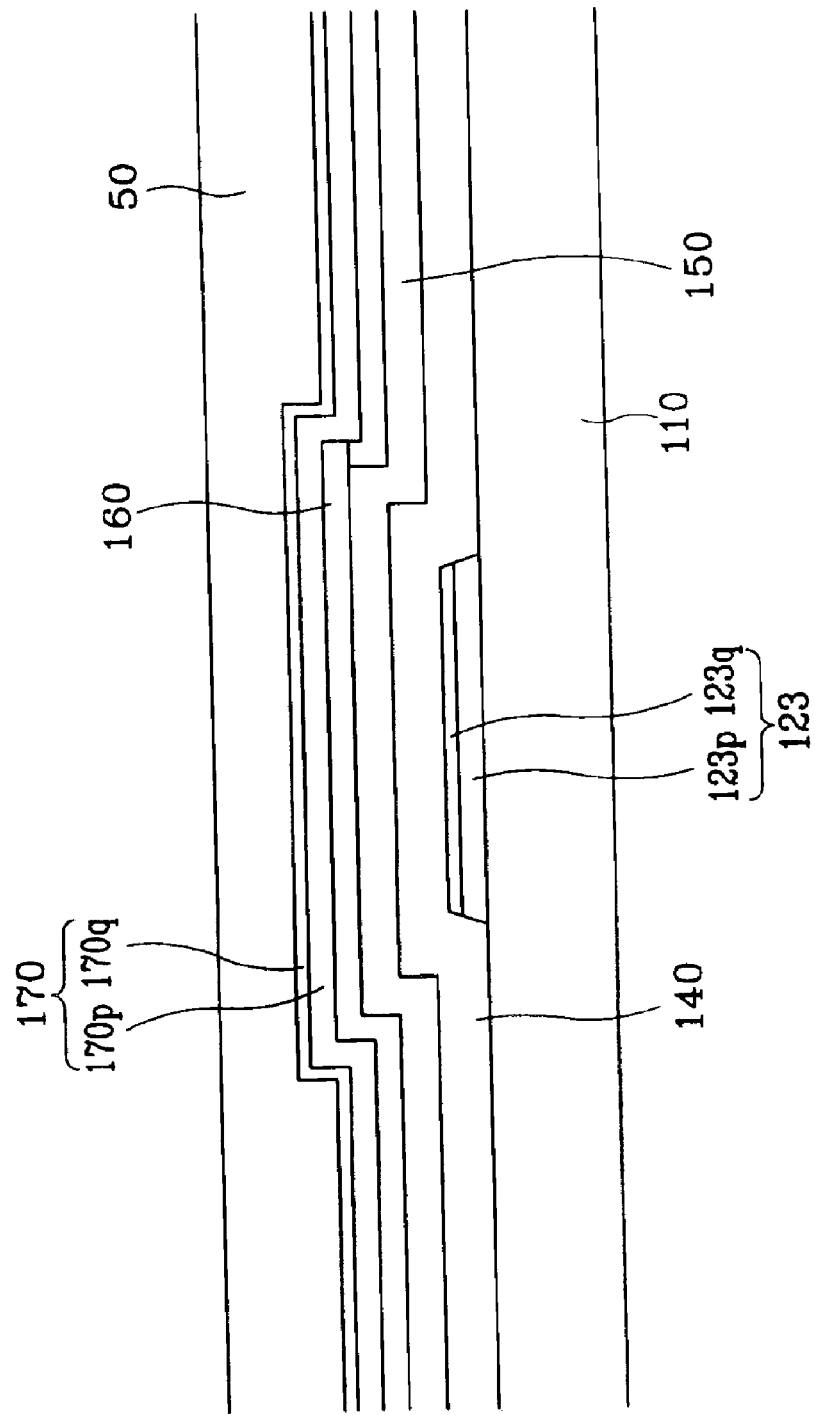

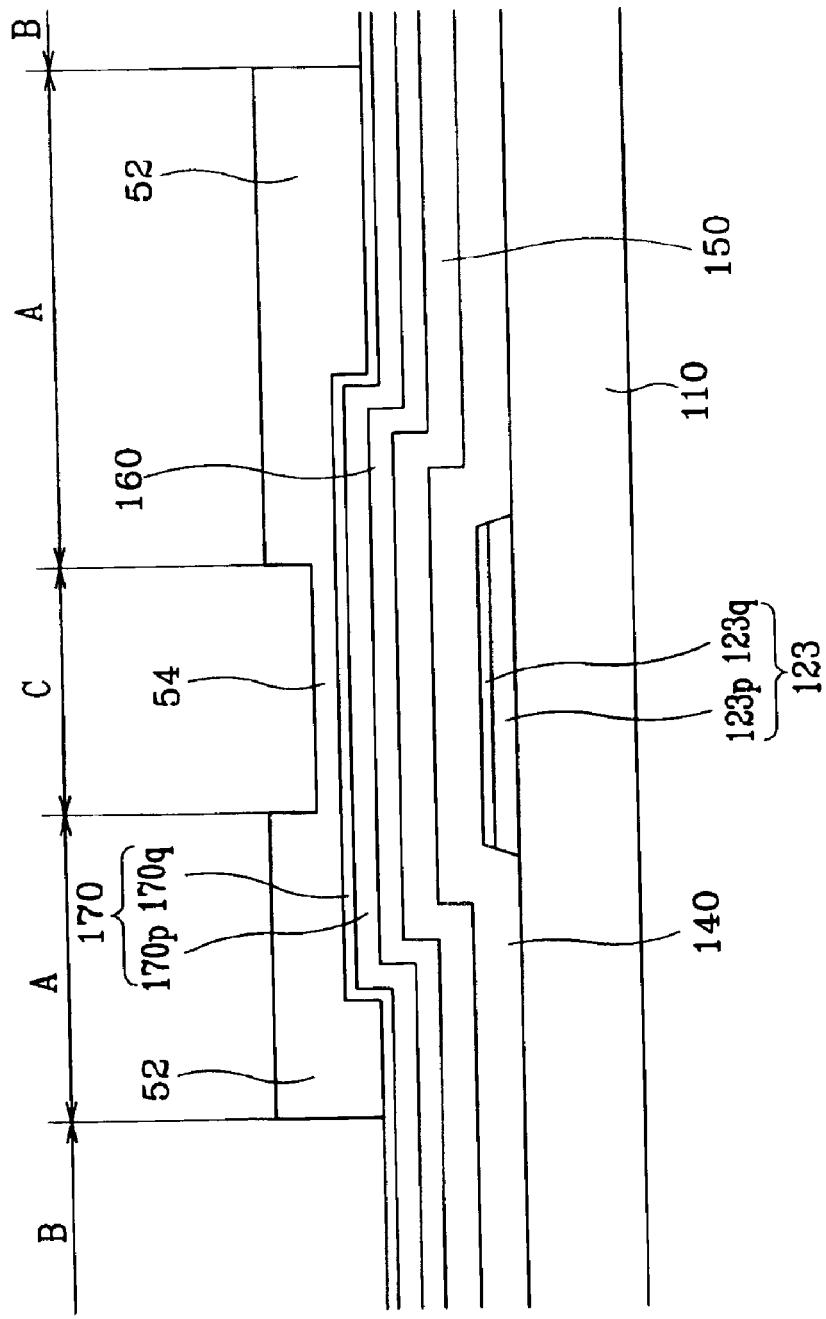

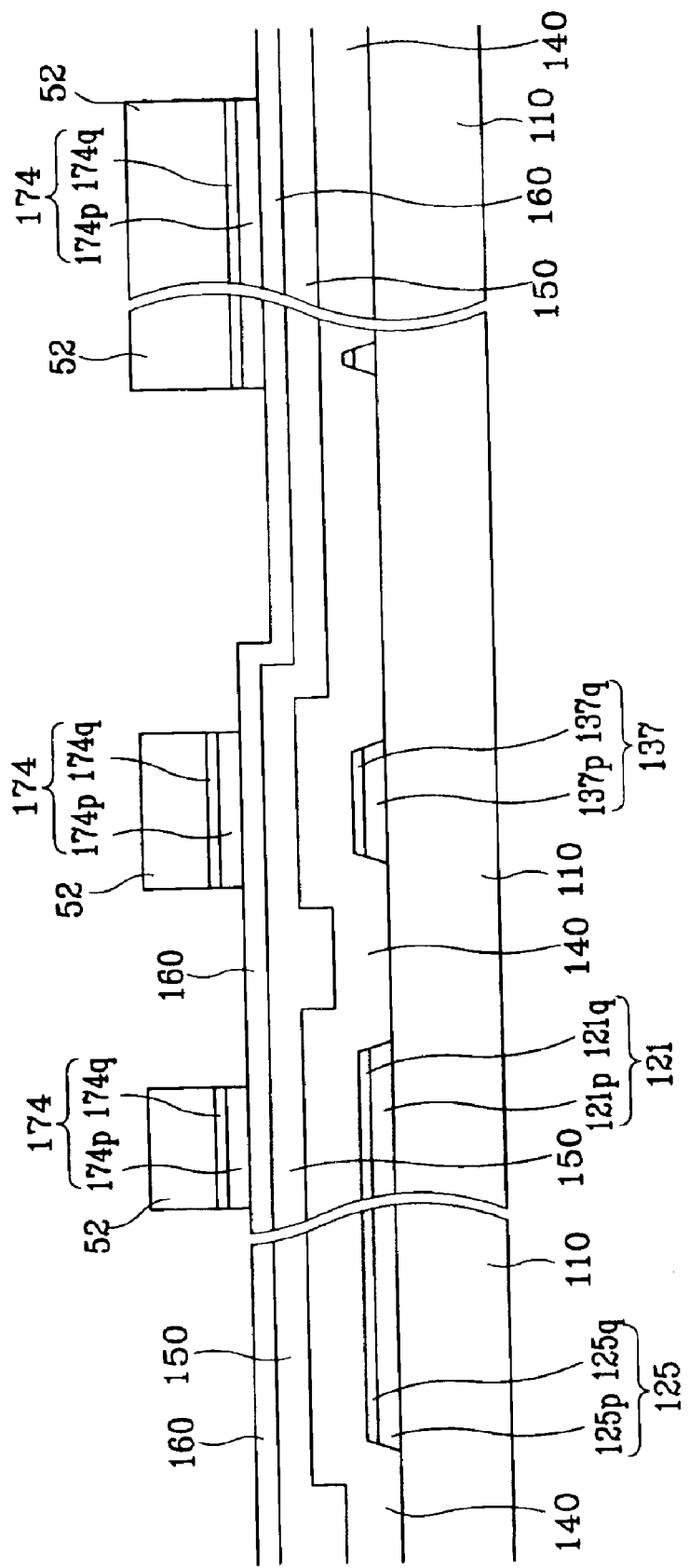

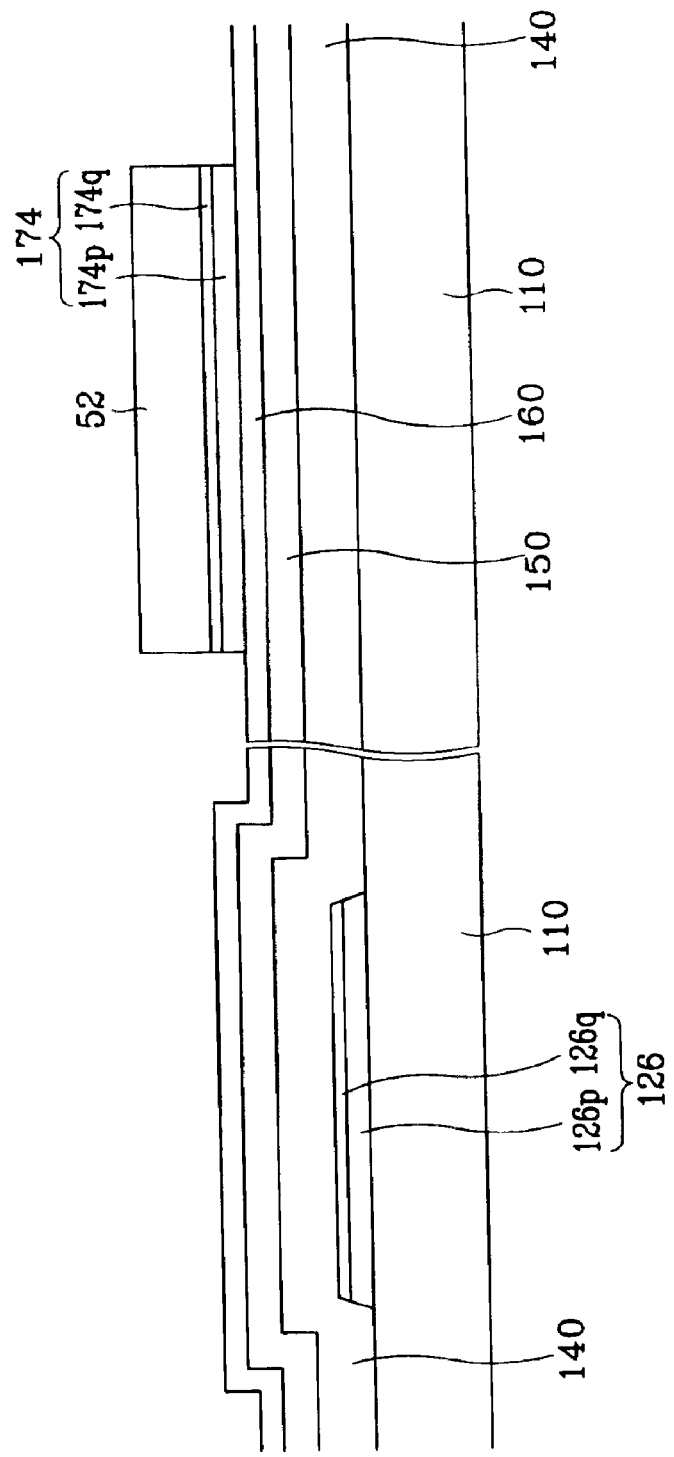

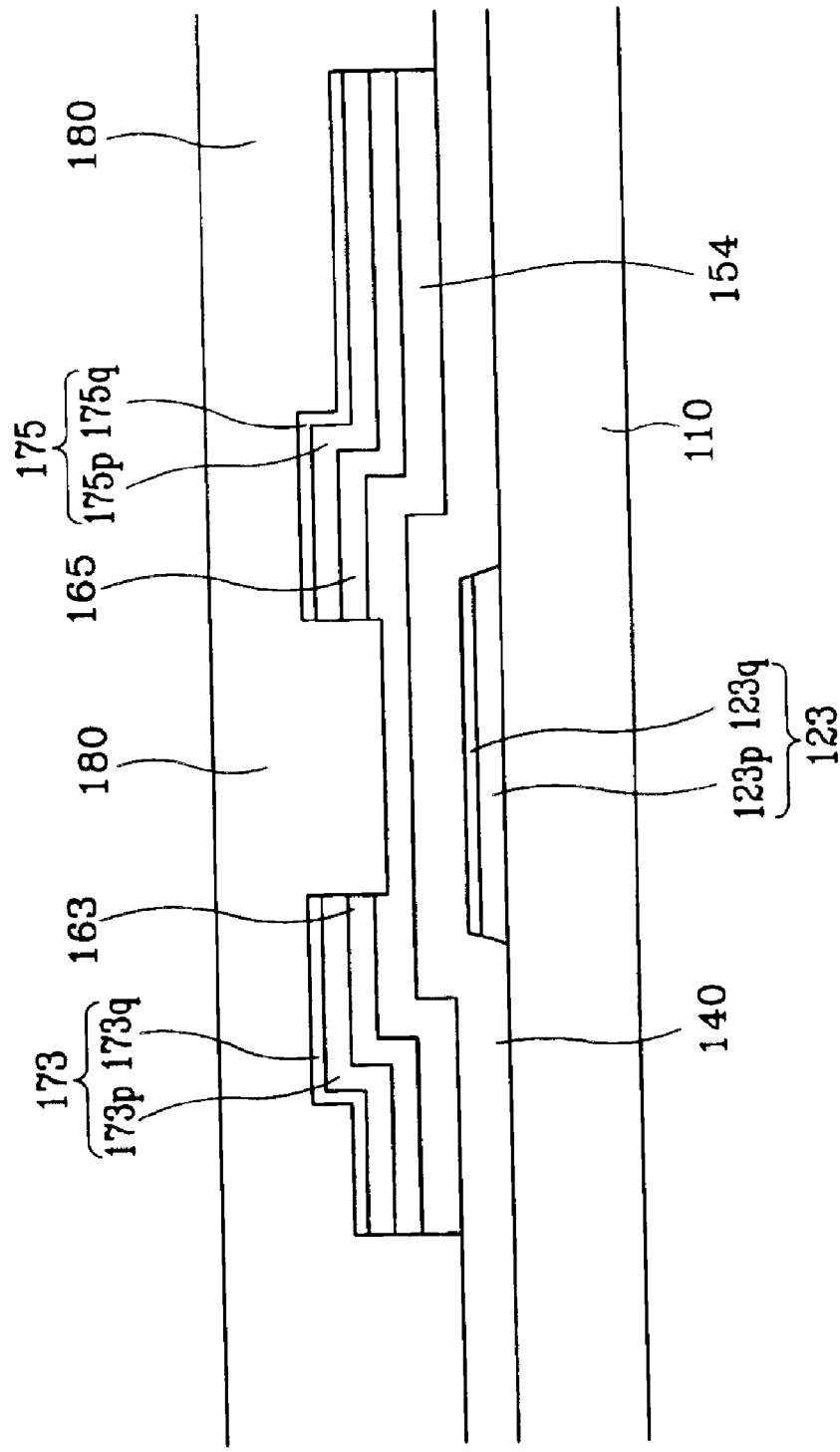

THIN FILM TRANSISTOR ARRAY PANEL AND MANUFACTURING METHOD THEREOF

BACKGROUND OF THE INVENTION (a) Field of the Invention

The present invention relates to a thin film transistor array panel and a manufacturing method thereof.

(b) Description of the Related Art

Liquid crystal displays (LCDs) are one of the most widely used flat panel displays. An LCD includes two panels provided with field-generating electrodes, a liquid crystal (LC) layer interposed therebetween, and a pair of polarizers attached to outer surfaces of the panels. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a kind of LCDs provides a plurality of pixel electrodes arranged in a matrix at one panel and a common electrode covering an entire surface of the other panel. The image display of the LCD is accomplished by applying individual voltages to the respective pixel electrodes. For the application of the individual voltages, a plurality of three-terminal thin film transistors (TFTs) are connected to the respective pixel electrodes, and a plurality of gate lines transmitting signals for controlling the TFTs and a plurality of data lines transmitting voltages to be applied to the pixel electrodes are provided on the panel.

The TFTs are easily damaged by electrostatic discharges (ESD) generated in a manufacturing process of the LCD. In order to prevent the TFTs from being damaged by the electrostatic charges, a plurality of ESD protection circuits are generally provided around edges of the LCD.

It is preferred that the ESD protection circuits exhibit good discharging characteristics and are made without an additional process step.

SUMMARY OF THE INVENTION

A thin film transistor array panel is provided, which includes: a plurality of gate lines formed on an insulating substrate; a gate insulating layer formed on the gate lines; a semiconductor layer formed on the gate insulating layer; a plurality of data lines formed at least in part on the semiconductor layer; a plurality of drain electrodes formed at least in part on the semiconductor layer; a plurality of pixel electrodes connected to the drain electrodes; and a plurality of conductive lines, each conductive line connected to one of the gate lines and the data lines and including first and second portions having different resistances.

Preferably, each conductive line includes a lower film and an upper film having resistivity lower than the lower film and the first portion of each conductive line does not include the upper film.

The thin film transistor array panel may further include a passivation layer disposed between the data lines and the pixel electrodes.

It is preferable that the passivation layer has a plurality of first contact holes exposing the first portions of the conductive lines, and the first contact holes expose edges of the first portions of the conductive lines. The thin film transistor array panel may further include a plurality of protective members formed of the same layer as the pixel electrodes and covering the first portions of the conductive lines.

The passivation layer may further have a plurality of second and third contact holes exposing portions of the gate lines and the data lines, respectively, and the thin film transistor array panel may further include a plurality of contact assistants formed of the same layer as the pixel electrodes and connected to the gate lines and the data lines through the second and the third contact holes, respectively.

The thin film transistor array panel may further include a plurality of ohmic contacts disposed between the semiconductor layer and the data lines.

The semiconductor layer may have substantially the same planar shape as the data lines and the drain electrodes except for portions located between the data lines and the drain electrodes.

The thin film transistor array panel may further include a shorting bar connected to the conductive lines.

The conductive lines preferably extend to an edge of the thin film transistor array panel.

A method of manufacturing a thin film transistor array panel is provided, the method includes: forming a gate line including an extension and a plurality of gate electrodes and a gate shorting bar on an insulating substrate, the gate line and the gate shorting bar including a first lower film and a first upper film having resistivity lower than the first lower film; forming a gate insulating layer; forming a semiconductor layer; forming a data line including an extension and a plurality of source electrodes, a plurality of drain electrodes, and a data shorting bar on an insulating substrate, the data line, the drain electrodes, and the gate shorting bar including a second lower film and a second upper film having resistivity lower than the second lower film; removing a first portion of the first upper film of the extension of the gate line and a second portion of the second upper film of the extension of the data line; and forming a plurality of pixel electrodes connected to the drain electrodes.

The first and the second lower films may include Cr, Mo or Mo alloy and the first and the second upper films may include Al or Al alloy.

The method may further include: forming a passivation layer between the drain electrodes and the pixel electrodes.

The formation of the passivation layer preferably include: depositing the passivation layer; and forming a plurality of contact holes exposing the first portion of the first upper film and the second portion of the second upper film.

The removal of the first and the second portions is preferably performed by blanket etching with an Al etchant.

BRIEF DESCRIPTION OF THE DRAWINGS

The above and other advantages of the present invention will become more apparent by describing preferred embodiments thereof in detail with reference to the accompanying drawings in which:

FIGS. 5B and 5C, FIGS. 6B and 6C, FIGS. 7B and 7C, and FIGS. 8B and 8C are sectional views of the TFT array panel shown in FIGS. 5A, 6A, 7A and 8A taken along the lines VB–VB' and VC–VC', VIB–VIB' and VIC–VIC', VIIB–VIIB' and VIIC–VIIC', and VIIIB–VIIIB' and VIIIC–VIIIC', respectively;

FIGS. 13B–13D are sectional views of the TFT array panel shown in FIG. 13A taken along the lines XIIIB–XIIIB', XIIIC–XIIIC' and XIIID–XIIID', respectively;

FIGS. 14A–14C are sectional views of the TFT array panel shown in FIG. 13A taken along the lines XIIIB–XIIIB', XIIIC–XIIIC' and XIIID–XIIID', respectively, and illustrate the step following the step shown in FIGS. 13B–13D;

FIGS. 15B–15D are sectional views of the TFT array panel shown in FIG. 15A taken along the lines XVB–XVB', XVC–XVC' and XVD–XVD', respectively;

FIGS. 16A, 17A and 18A, FIGS. 16B, 17B and 18B, and FIGS. 16C, 17C and 18C are respective sectional views of the TFT array panel shown in FIG. 15A taken along the lines XVB–XVB', XVC–XVC' and XVD–XVD', respectively, and illustrate the steps following the step shown in FIGS. 15B–15D;

FIGS. 19B–19D are sectional views of the TFT array panel shown in FIG. 19A taken along the lines XIXB–XIXB', XIXC–XIXC' and XIXD–XIXD', respectively.

DETAILED DESCRIPTION OF PREFERRED EMBODIMENTS

Figure 1:
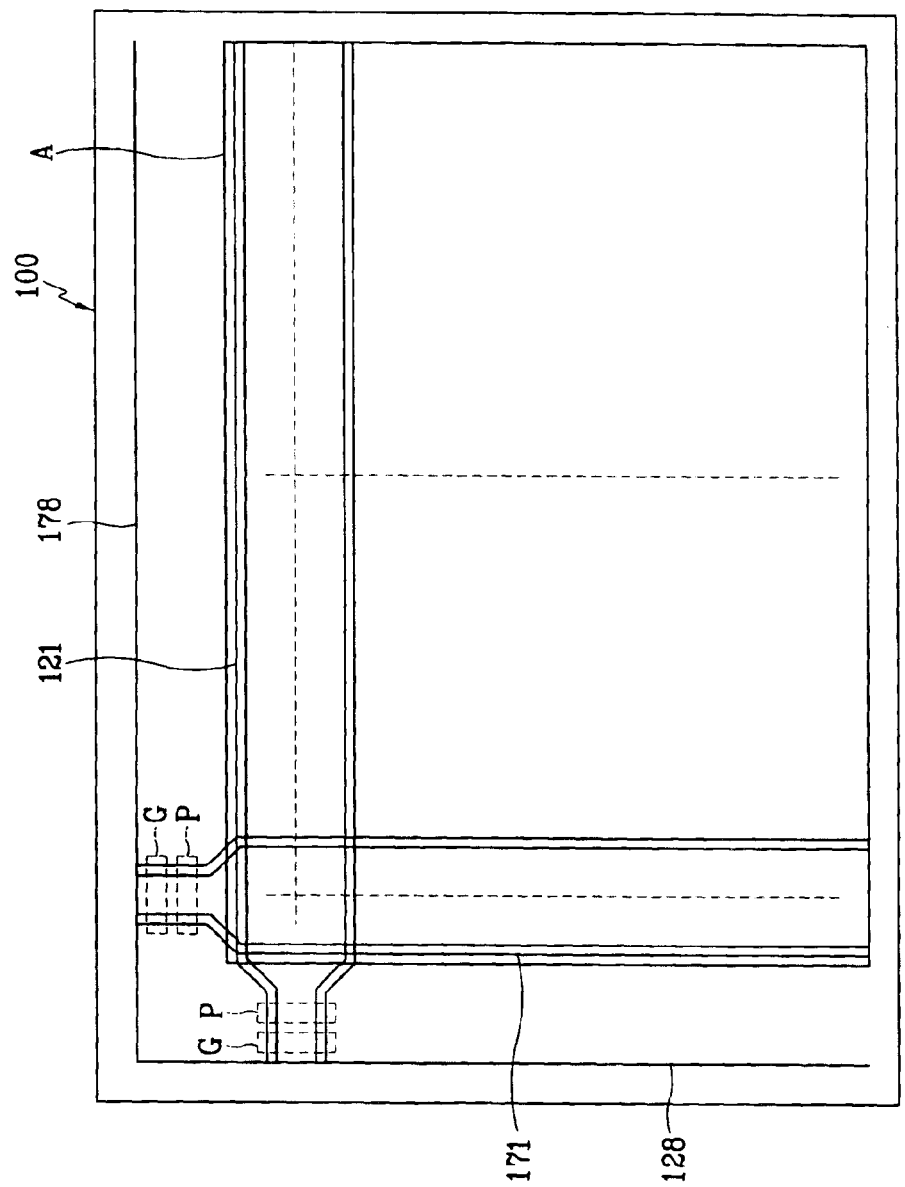
FIG. 1 is a schematic diagram of a TFT array panel for an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

First, a TFT array panel for an LCD according to an embodiment of the present invention will be described in detail with reference to FIG. 1.

FIG. 1 is a schematic diagram of a TFT array panel according to an embodiment of the present invention.

As shown in FIG. 1, a TFT array panel according to an embodiment of the present invention includes a plurality of gate lines 121 transmitting gate signals (also called scanning signals), a plurality of data lines 171 transmitting data signals, a plurality of switching elements (not shown) connected to the gate lines 121 and the data lines 171, and a plurality of pixel electrodes (not shown) connected to the switching elements. The pixel electrodes are made of transparent conductive material or reflective conductive material, and the switching elements such as TFTs selectively transmits data signals to the pixel electrodes in response to the gate signals.

A pair of shorting bars 128 and 178 are provided near edges of the TFT array panel 100. The shorting bars 128 and 178 are connected to all the gate lines 121 and all the data lines 171, respectively, and the shorting bars 128 and 178 may be connected to each other. The shorting bars 128 and 178 spread electrostatic charges introduced into the panel 100 in a manufacturing process into all the gate lines 121 and all the data lines 171, thereby preventing the TFTs.

The TFT array panel 100 includes a display area A where the pixel electrodes are arranged in a matrix, a circuit connection area P where the gate lines 121 and the data lines 171 are connected to driving circuits providing signals therefor, and a discharge connection area G where the gate lines 121 and the data lines 171 extend to be connected to the shorting bars 128 and 178.

Each of the gate lines 121 and the data lines 171 includes a portion having low resistance and a portion having high resistance in the discharge connection area G. As described above, the electrostatic charges generated in the manufacturing process are spread into the gate lines 121 and the data lines 171 through the shorting bars 128 and 178. Before reaching the circuit connection area P and the display area A, the electric charges experience spark discharge due to the abrupt change of the resistance of the gate lines 121 and the data lines 171 on the discharge connection area G to be discharged.

A TFT array panel for an LCD according to an embodiment of the present invention will be described in detail with reference to FIGS. 2 to 4.

Figure 2:
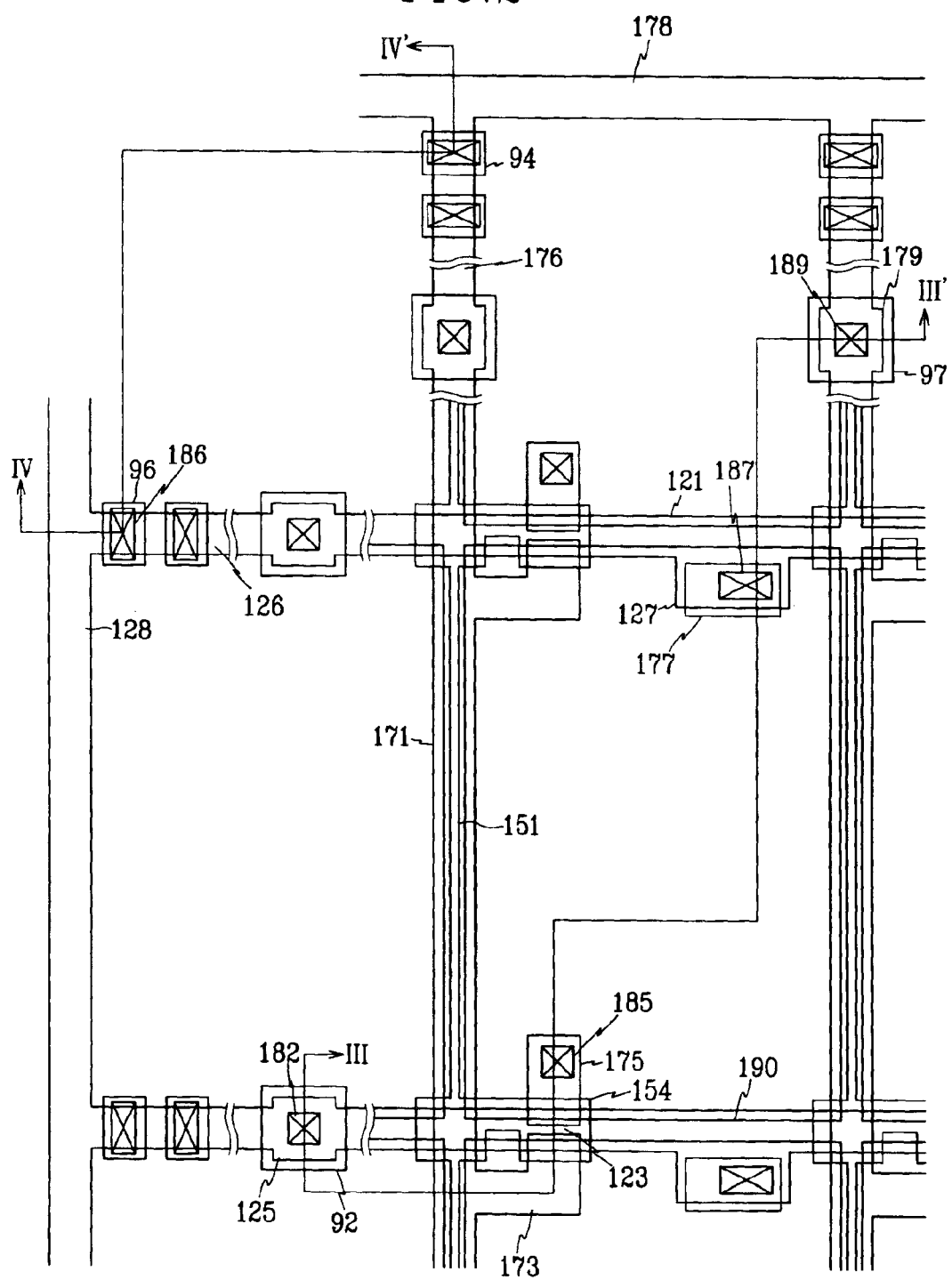
FIG. 2 is a layout view of an exemplary TFT array panel for an LCD according to an embodiment of the present invention.
Figure 3:
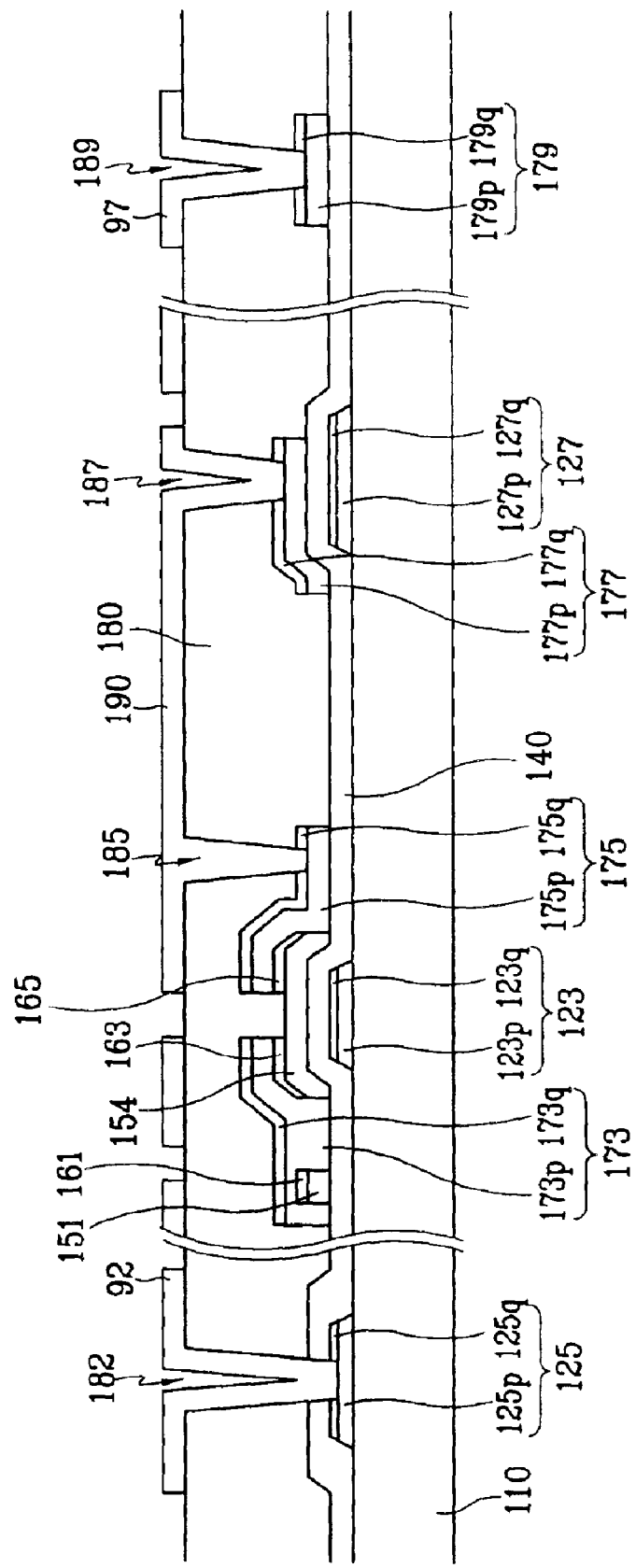
FIGS. 3 and 4 are sectional views of the TFT array panel shown in FIG. 2 taken along the lines III–III' and IV–IV', respectively.
Figure 4:
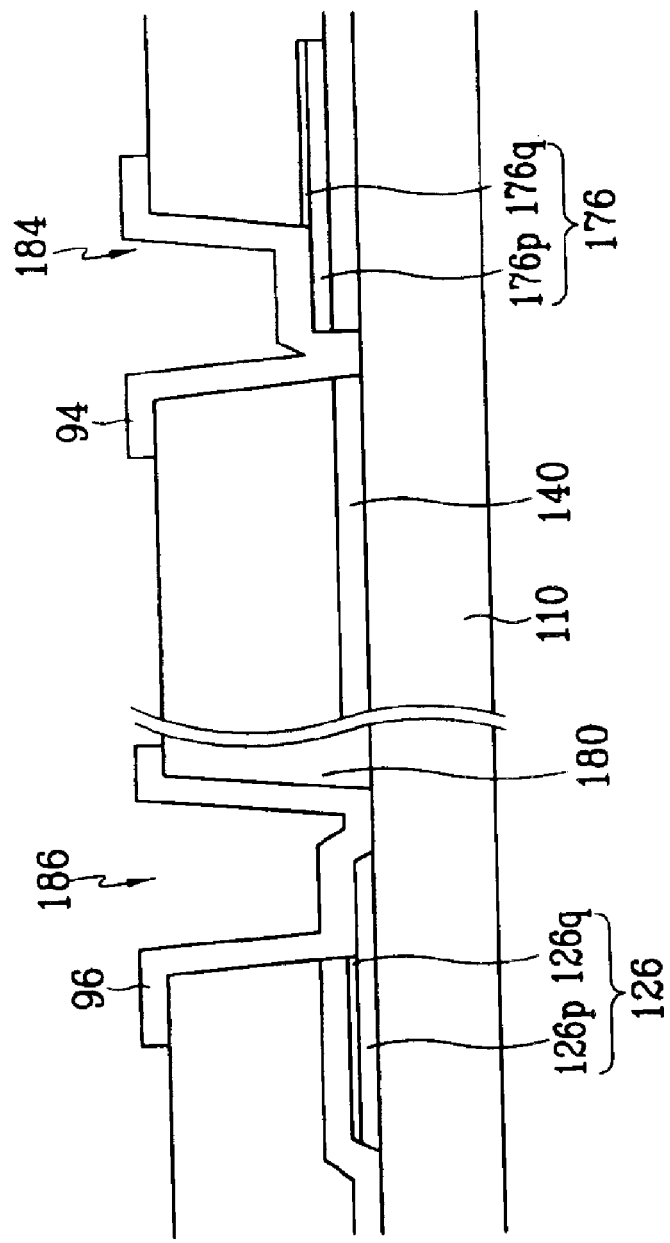

FIG. 2 is a layout view of an exemplary TFT array panel for an LCD according to an embodiment of the present invention, and FIGS. 3 and 4 are sectional view of the TFT array panel shown in FIG. 2 taken along the lines III–III' and IV–IV', respectively.

A plurality of gate lines 121 for transmitting gate signals and a gate shorting bar 128 are formed on an insulating substrate 110.

Each gate line 121 extends substantially in a transverse direction and includes a connecting portion 125 for connection to a driving circuit (not shown), an extension 126 for connection to the gate shorting bar 128, and a plurality of expansions 127 protruding downward. A plurality of portions of each gate line 121 form a plurality of gate electrodes 123.

The gate shorting bar 128 extends substantially in the transverse direction and is connected to the extensions 126 of the gate lines 121.

The gate lines 121 and the gate shorting bar 128 include two films having different physical characteristics, a lower film and an upper film. The upper film is preferably made of low resistivity metal including Al containing metal such as Al and Al alloy and Ag containing metal such as Ag and Ag alloy for reducing signal delay or voltage drop in the gate lines 121. On the other hand, the lower film is preferably made of material such as Cr, Mo and Mo alloy (e.g., MoW alloy), which has good physical, chemical and electrical contact characteristics with other materials such as IZO (indium zinc oxide) and ITO (indium tin oxide). A good exemplary combination of the lower film material and the upper film material is Cr and Al—Nd alloy. The lower and upper films of the gate electrodes 123, the connecting portions 125, the extensions 126, and the expansions 127 are indicated by 123p and 123q, 125p and 125q, 126p and 126q, and 127p and 127q, respectively.

The lateral sides of the upper film and the lower film are tapered, and the inclination angle of the lateral sides with respect to a surface of the substrate 110 ranges about 30–70 degrees.

A gate insulating layer 140 preferably made of silicon nitride (SiNx) is formed on the gate lines 121 and the gate shorting bar 128.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of projections 154 branched out toward the gate electrodes 123. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30–80 degrees.

A plurality of data lines 171, a plurality of drain electrodes 175, a plurality of storage capacitor conductors 177, and a data shorting bar 178 are formed on the ohmic contacts 161 and 165 and the gate insulating layer 140.

The data lines 171 for transmitting data voltages extend substantially in the longitudinal direction and intersect the gate lines 121. Each data line 171 includes a connecting portion 179 for connection to a driving circuit (not shown) and an extension 176 for connection to the data shorting bar 178.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the expansions 127 of the gate lines 121.

The data shorting bar 178 extends substantially in the transverse direction and is connected to the extensions 176 of the data lines 171.

The data lines 171, the drain electrodes 175, the storage capacitor conductors 177, and the data shorting bar 178 also include a lower film preferably made of Mo, Mo alloy or Cr and an upper film located thereon and preferably made of Al containing metal. The lower and upper films of the source electrode 173, the drain electrodes 175, the extensions 176, the storage capacitor conductors 177, and the connecting portions 179 are indicated by 17p and 173q, 175p and 175q, 176p and 176q, 177p and 177q, and 179p and 179q, respectively.

Like the gate lines 121 and the gate shorting bar 128, the lower film and the upper film of the data lines 171, the drain electrodes 175, the storage capacitor conductors 177, and the data shorting bar 178 have tapered lateral sides, and the inclination angles thereof range about 30–80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines as described above, to enhance the insulation between the gate lines 121 and the data lines 171.

A passivation layer 180 is formed on the data lines 171, the drain electrodes 175, the storage conductors 177, the data shorting bar 178, and the exposed portions of the semiconductor stripes 151. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride. When the passivation layer 180 is made of organic material, it is preferable that the passivation layer 180 does not cover a circuit connection area P (shown in FIG. 1) and furthermore, there is no organic material in the circuit connection area P, which is particularly advantageous for a COG (chip on glass) type mounting driving circuit chips on the TFT panel 100. The passivation layer 180 may have a dual-layered structure including a lower SiNx layer and an upper organic layer.

The passivation layer 180 has a plurality of contact holes 184, 185, 187 and 189 exposing the extensions 176 of the data lines 171, the drain electrodes 175, the storage conductors 177, and the connecting portions 179 of the data lines 171, respectively. The passivation layer 180 and the gate insulating layer 140 have a plurality of contact holes 182 and 186 exposing the connecting portions 125 and the extensions 126 of the gate lines 121.

The contact holes 182, 184, 185, 186, 187 and 189 expose portions of the lower films 125p, 176p, 175p, 126p, 177p and 179p of the connecting portions 125 of the gate lines 121, the extensions 176 of the data lines 171, the drain electrodes 175, the extensions 126 of the gate lines 121, the storage capacitor conductors 177, and the connecting portions 179 of the data lines 171, respectively. In addition, FIGS. 2 and 4 shows that the contact holes 184 and 186 expose edges of the lower films 176p and 126p, which is optional. Each of the gate lines 121 and the data lines 171 preferably includes at least two contact holes 186 and 184.

Since the exposed portions of the extensions 126 and 176 have no upper film 126p and 176p with relatively low resistivity, they have relatively high resistance compared with other portions. Accordingly, the electrostatic charges generated in the manufacturing process generate sparks to be discharged. The spark may disconnect the lower film of the exposed portions.

A plurality of pixel electrodes 190, a plurality of contact assistants 92 and 97, and a plurality of protective members 94 and 96 are formed on the passivation layer 180, and they are made of transparent conductive material such as ITO, IZO and conductive polymer, or reflective conductive material.

The pixel electrodes 190 are physically and electrically connected to the drain electrodes 175 through the contact holes 185 and to the storage capacitor conductors 177 through the contact holes 187 such that the pixel electrodes 190 receive the data voltages from the drain electrodes 175 and transmit the received data voltages to the storage capacitor conductors 177. The pixel electrodes 190 supplied with the data voltages generate electric fields in cooperation with a common electrode (not shown) on the other panel (not shown) supplied with a common voltage, which reorient liquid crystal molecules in the liquid crystal layer (not shown) disposed therebetween.

A pixel electrode 190 and a common electrode form a "liquid crystal capacitor", which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the gate lines 121 adjacent thereto (called "previous gate lines"). The capacitances of the storage capacitors, i.e., the storage capacitances are increased by providing the expansions 127 at the gate lines 121 for increasing overlapping areas and by providing the storage capacitor conductors 177, which are connected to the pixel electrodes 190 and overlap the expansions 127, under the pixel electrodes 190 for decreasing the distance between the terminals.

The pixel electrodes 190 overlap the gate lines 121 and the data lines 171 to increase aperture ratio but it is optional.

The contact assistants 92 and 97 are connected to the exposed connecting portions 125 of the gate lines 121 and the exposed connecting portions 179 of the data lines 171 through the contact holes 182 and 189, respectively. The contact assistants 92 and 97 are not requisites but preferred to protect the exposed portions 125 and 179 and to complement the adhesiveness of the exposed portion 125 and 179 and external devices.

The protective members 94 and 96 are provided for protecting exposed portions of the lower film 176p, 126p.

A method of manufacturing the TFT array panel shown in FIGS. 2–4 according to an embodiment of the present invention will be now described in detail with reference to FIGS. 5A–8C as well as FIGS. 2–4.

FIGS. 5A, 6A, 7A and 8A are layout views of the TFT array panel shown in FIGS. 2–4 in intermediate steps of a manufacturing method thereof according to an embodiment of the present invention, and FIGS. 5B and 5C, FIGS. 6B and 6C, FIGS. 7B and 7C, and FIGS. 8B and 8C are sectional views of the TFT array panel shown in FIGS. 5A, 6A, 7A and 8A taken along lines VB–VB' and VC–VC', lines VIB–VIB' and VIC–VIC', lines VIIB–VIIB' and VIIC–VIIC', and lines VIIIB–VIIIB' and VIIIC–VIIIC', respectively.

Figure 5A:
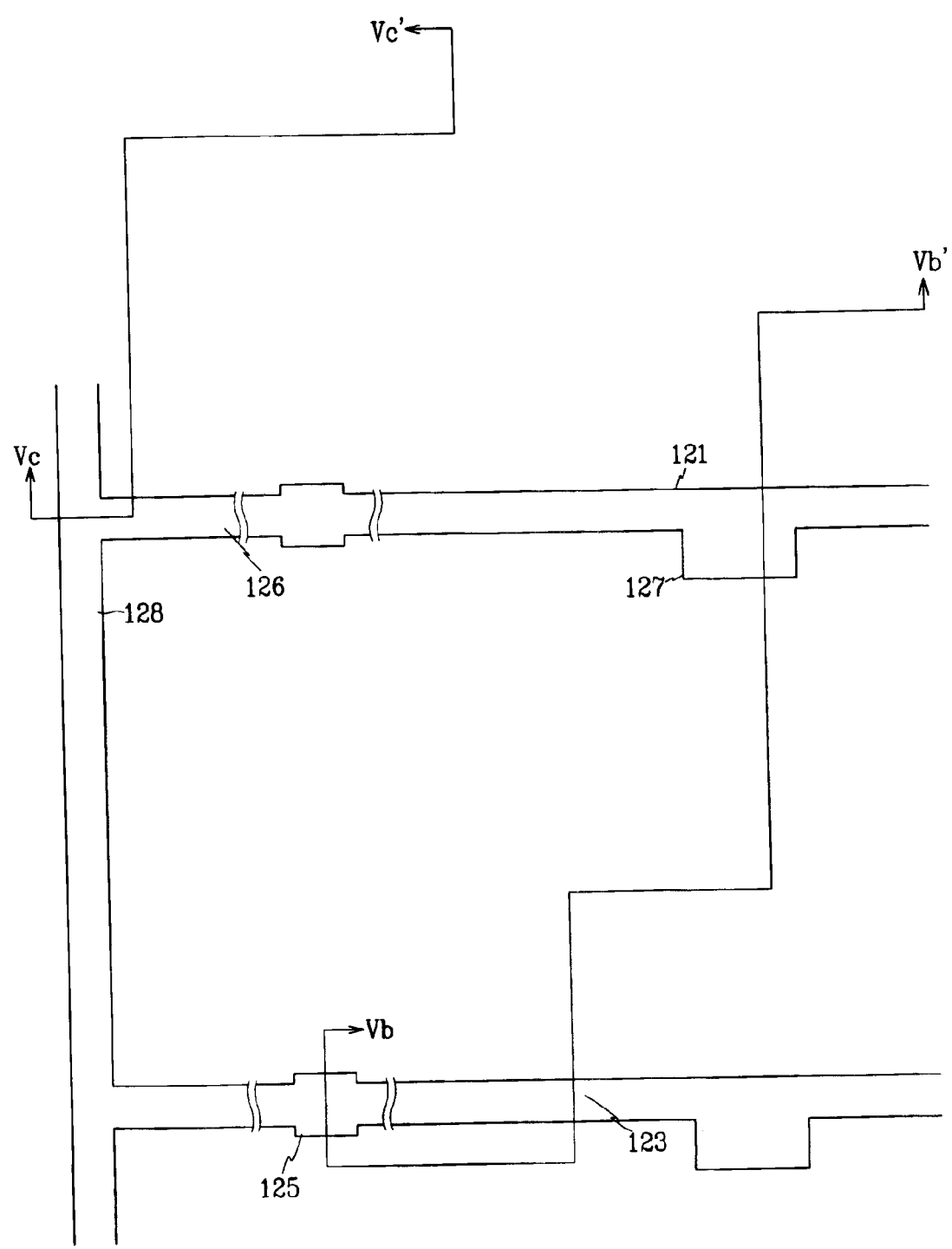
FIGS. 5A, 6A, 7A and 8A are layout views of the TFT array panel shown in FIGS. 2–4 in intermediate steps of a manufacturing method thereof according to an embodiment of the present invention.
Figure 5B:
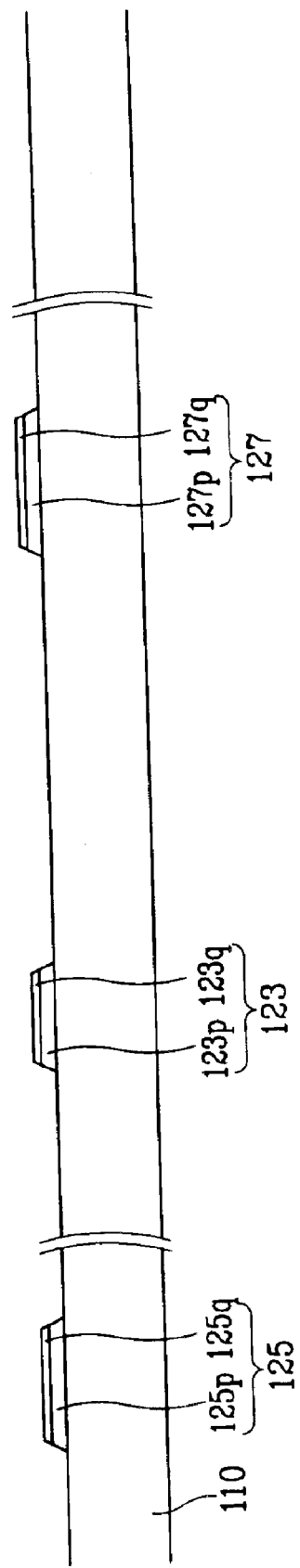
Figure 5C:
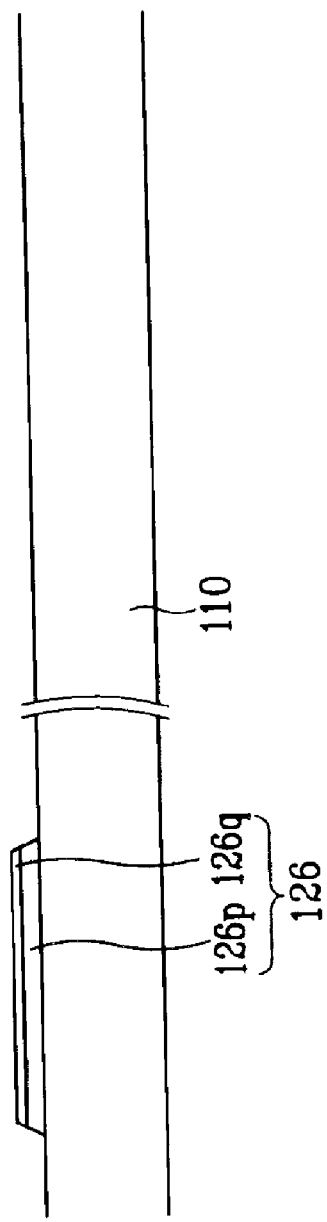

Referring to FIGS. 5A–5C, two conductive films, a lower conductive film and an upper conductive film are sputtered in sequence on an insulating substrate 110 such as transparent glass. The upper conductive film and the lower conductive film are photo-etched to form a gate shorting bar 128 and a plurality of gate lines 121 including a plurality of gate electrodes 123, a plurality of connecting portions 125, a plurality of extensions 126, and a plurality of expansions 127. The lower conductive film is made of Mo, Mo alloy or Cr, while the upper conductive film is preferably made of Al containing metal.

Figure 6A:
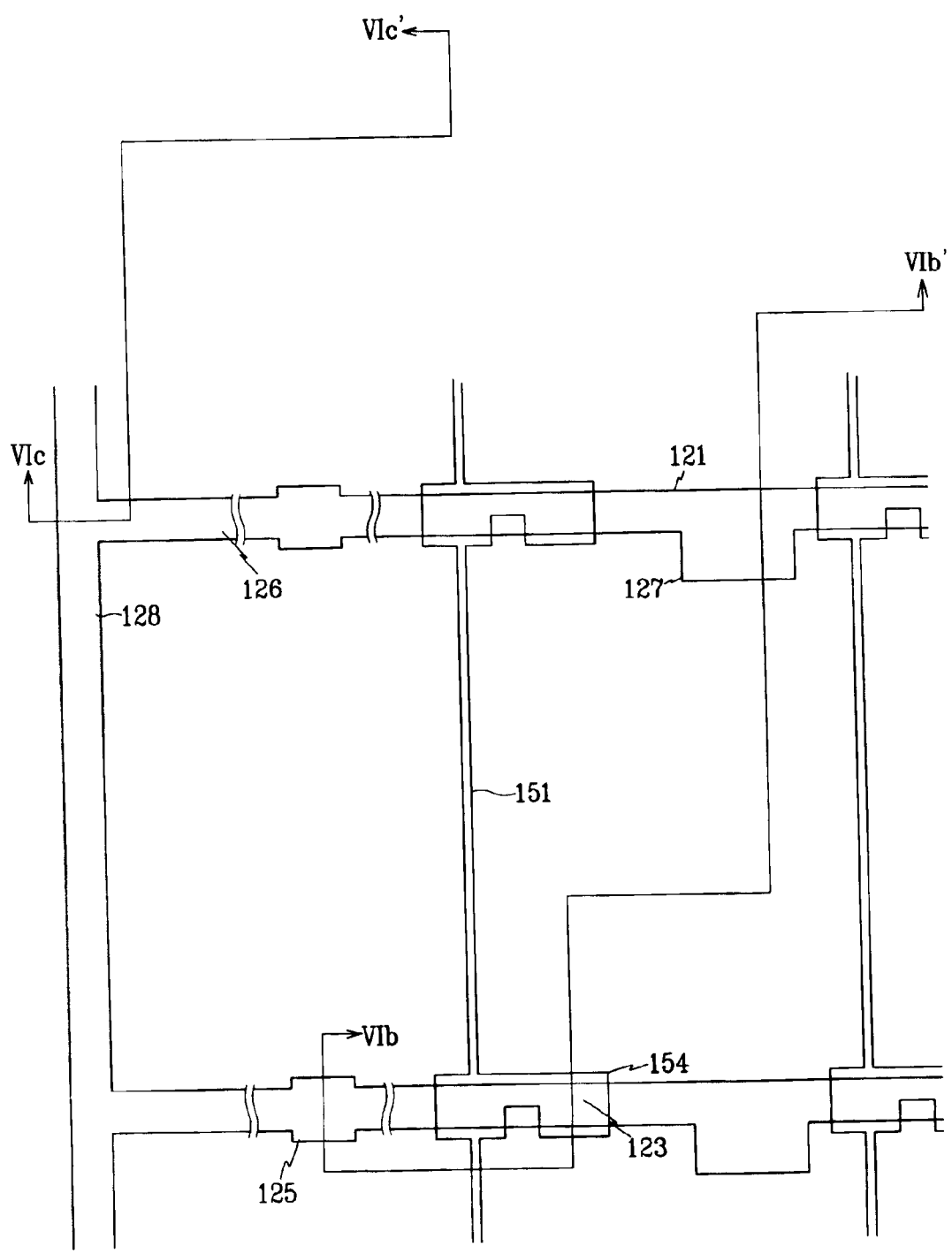
Figure 6B:
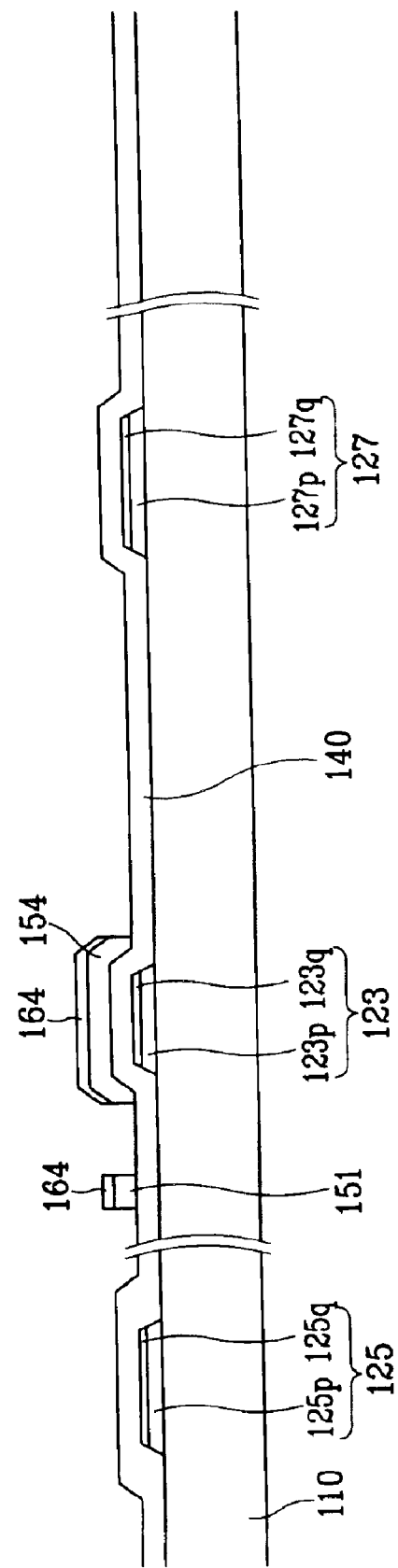
Figure 6C:
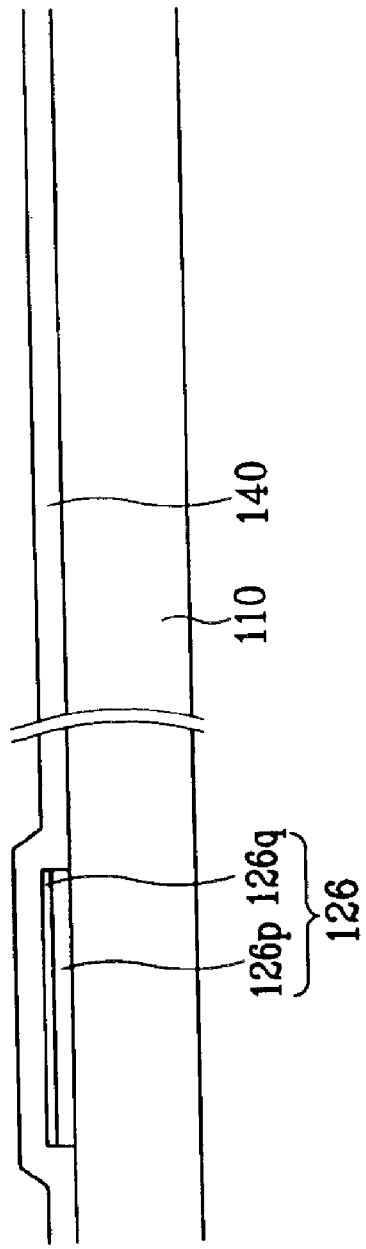

Referring to FIGS. 6A–6C, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140.

Figure 7A:
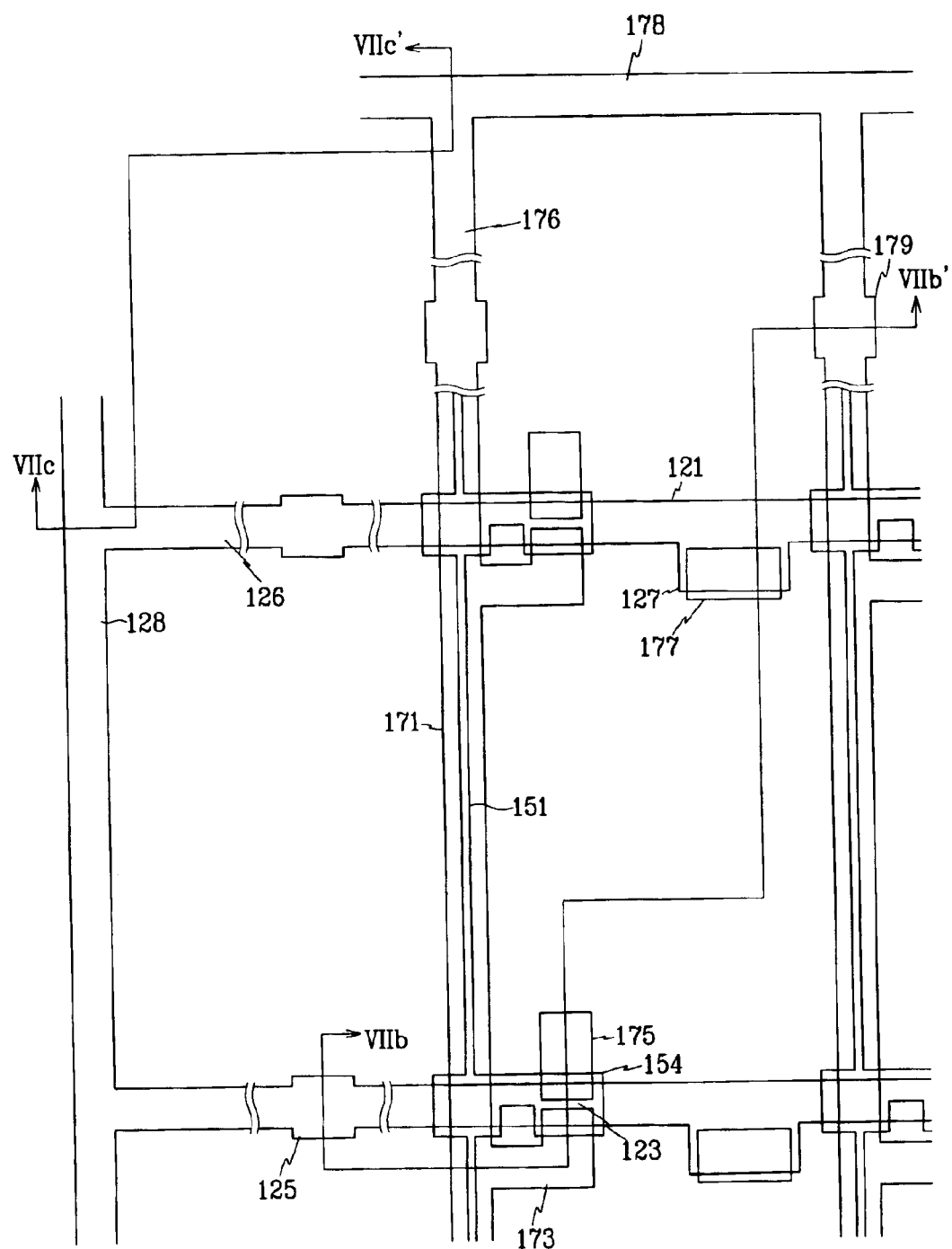
Figure 7B:
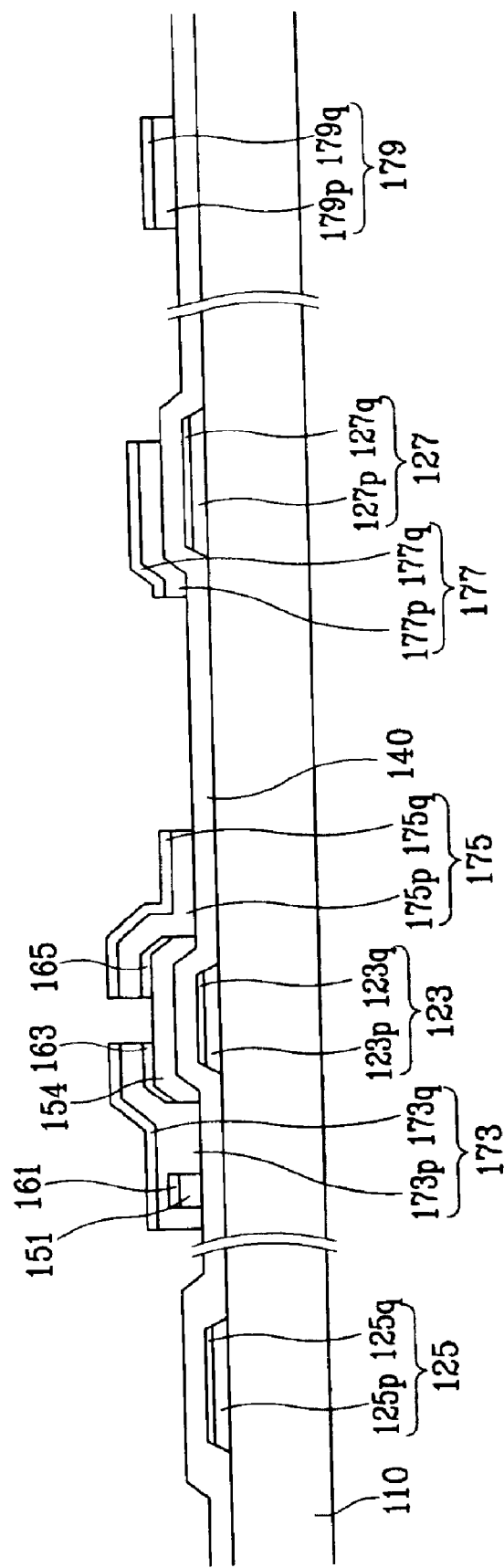
Figure 7C:
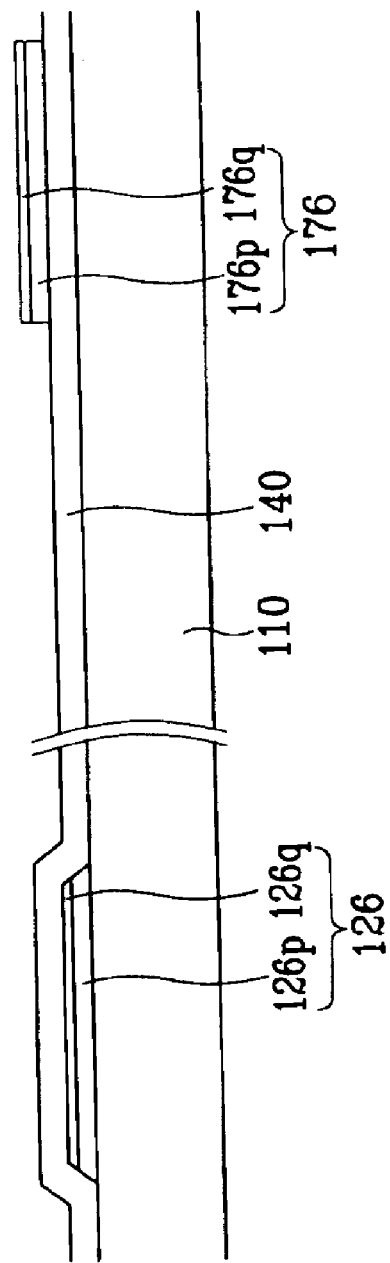

Referring to FIGS. 7A–7C, two conductive films, a lower conductive film and an upper conductive film are sputtered in sequence and photo-etched to form a plurality of data lines 171 including a plurality of source electrodes 173, a plurality of extensions 176 and a plurality of connecting portions 179, a plurality of drain electrodes 175, a plurality of storage capacitor conductors 177, and a data shorting bar 178. The lower conductive film is made of Mo, Mo alloy or Cr, while the upper conductive film is preferably made of Al containing metal.

Thereafter, portions of the extrinsic semiconductor stripes 164, which are not covered with the data lines 171, the drain electrodes 175, the storage capacitor conductors 177, and the data shorting bar 178, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

Figure 8A:
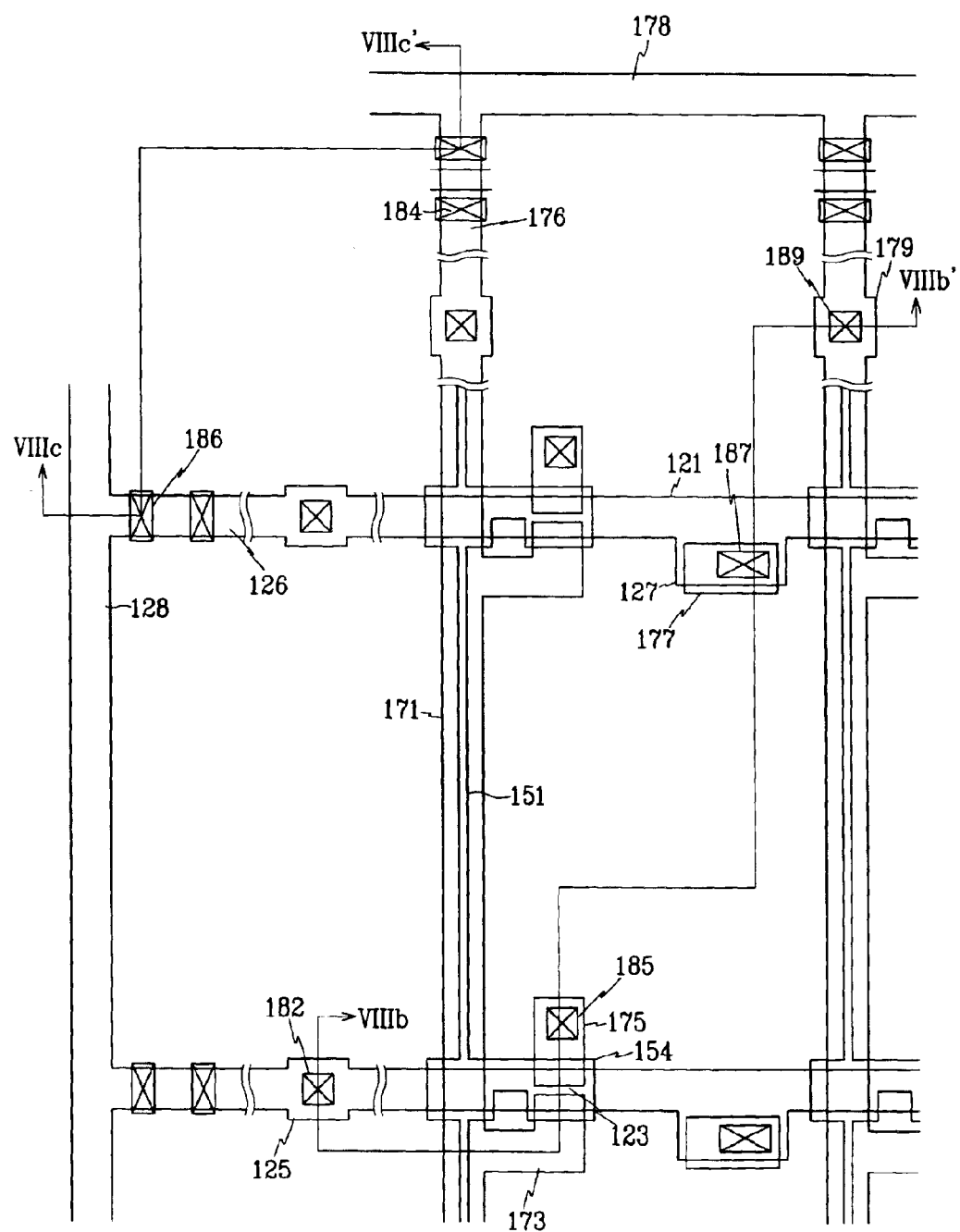

As shown in FIGS. 8A–8C, after depositing a passivation layer 180, the passivation layer 180 and the gate insulating layer 140 are photo-etched to form a plurality of contact holes 182, 184, 185, 186, 187 and 189 exposing the upper films 125q, 176q, 175q, 126q, 177q and 179q of the connecting portions 125 of the gate lines 121, the extensions 176 of the data lines 176, the drain electrodes 175, the extensions 126 of the gate lines 121, the storage capacitor conductors 177, and the connecting portions 179 of the data lines 171, respectively.

Thereafter, the exposed portions of the upper films 125q, 176q, 175q, 126q, 177q and 179q are removed by blanket etching with an Al etchant. This step makes two portions with different resistance in the extensions 126 and 176 without an additional photo-etching step.

Finally, as shown in FIGS. 2–4, a plurality of pixel electrodes 190, a plurality of contact assistants 92 and 97, and a plurality of protective members 94 and 96 are formed on the passivation layer 180 by sputtering and photo-etching an ITO or IZO layer. An example of sputtering target is IDIXO (indium x-metal oxide) produced by Idemitsu Co. of Japan. The sputtering target includes $In_2O_3$ and $ZnO$, and the ratio of Zn with respect to the sum of Zn and In is preferably in a range of about 15–20 atomic %. The preferred sputtering temperature for minimizing the contact resistance is equal to or lower than about 250° C.

The shorting bars 128 and 178 and the extensions 126 and 176 are used for applying electrical signals for testing disconnection or short circuit of the gate lines 121 and 171 and defect of pixels. The connection between the shorting bars 128 and 178 and the signal lines 121 and 171 are released after combining the TFT array panel and an opposite panel and defect testing.

A TFT array panel for an LCD according to another embodiment of the present invention will be described in detail with reference to FIGS. 9–12.

Figure 9:
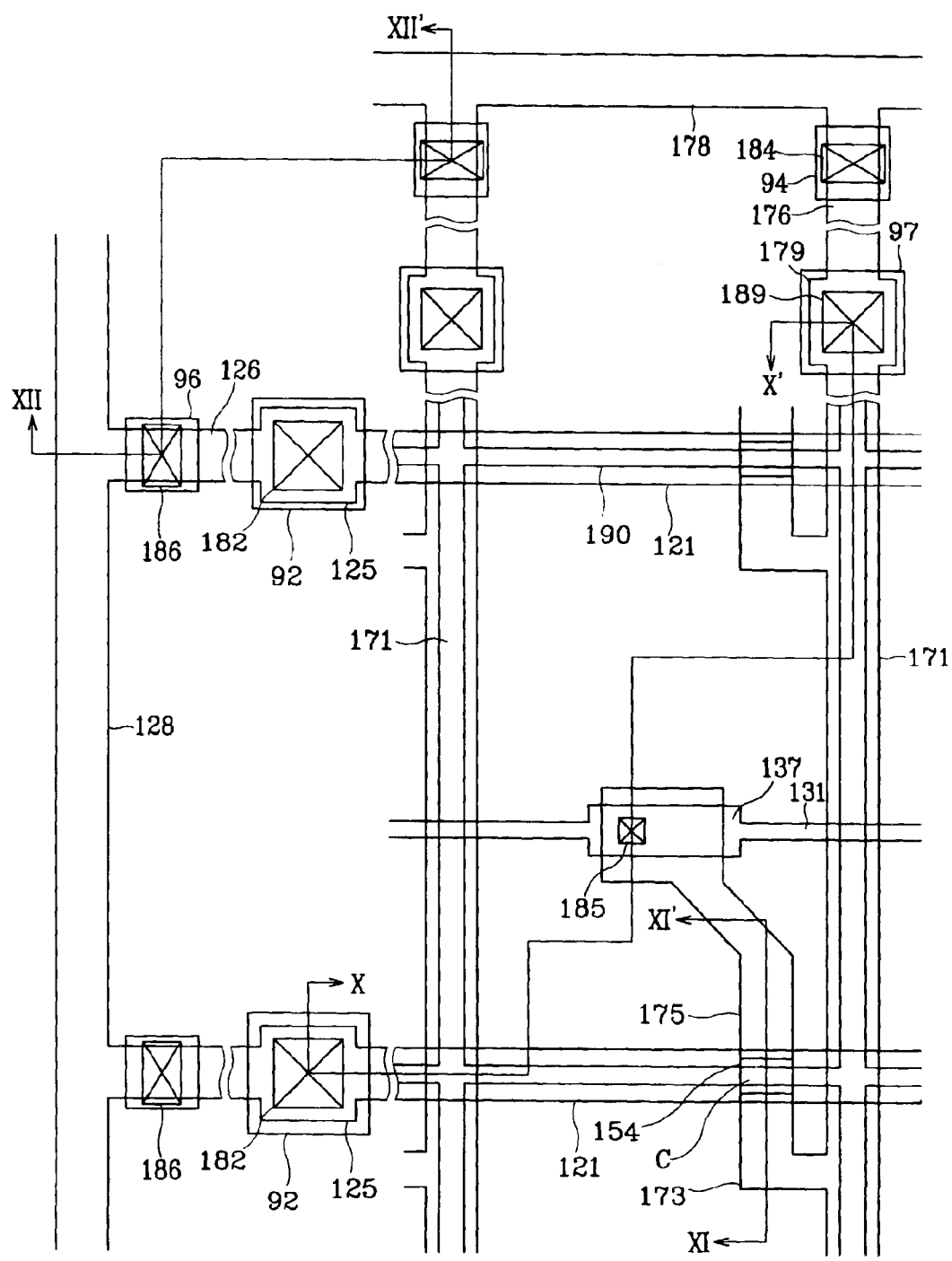
FIG. 9 is a layout view of an exemplary TFT array panel for an LCD according to another embodiment of the present invention.
Figure 10:
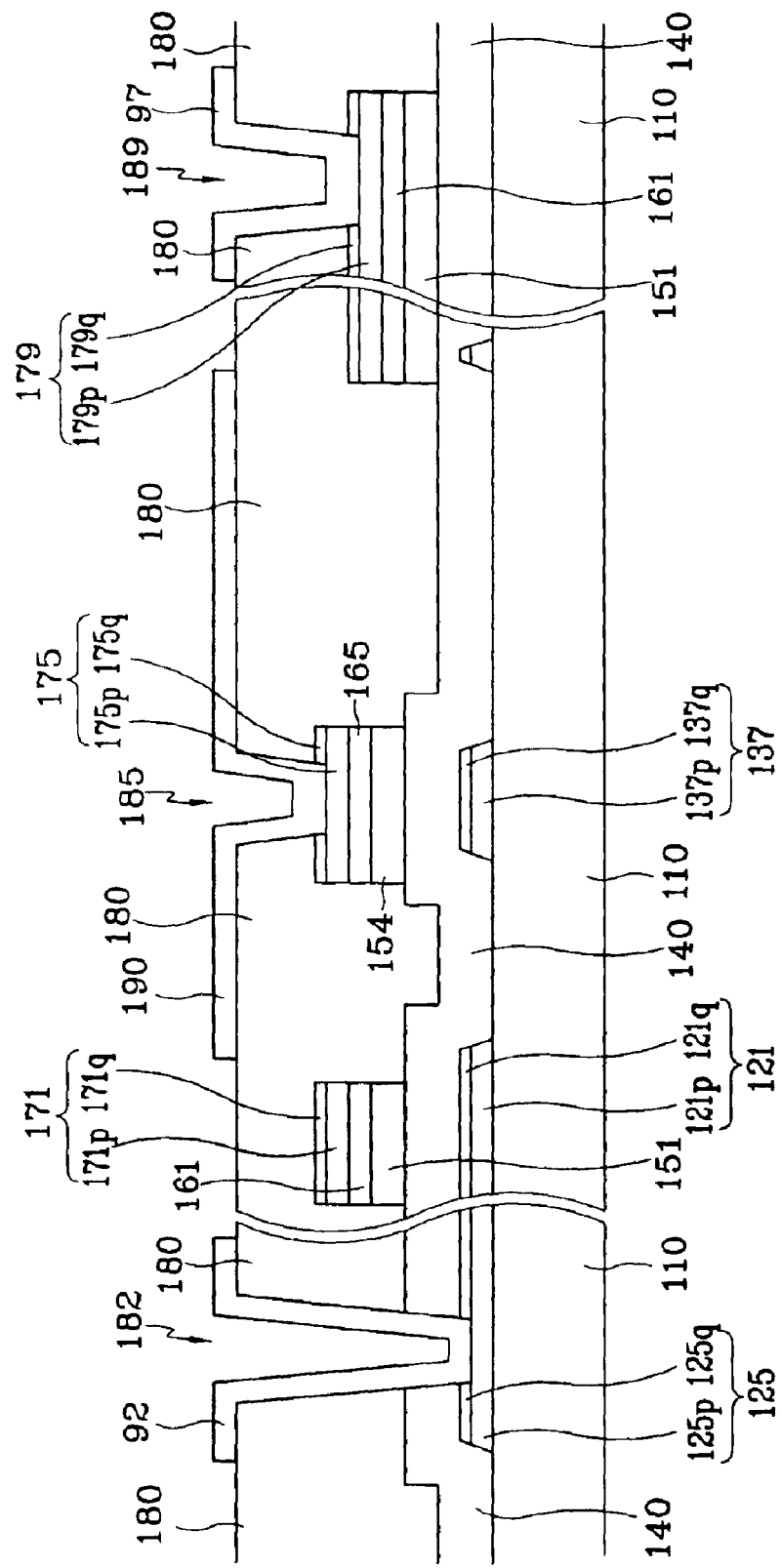
FIGS. 10–12 are sectional views of the TFT array panel shown in FIG. 9 taken along the lines X–X', XI–XI' and XII–XII', respectively.
Figure 11:
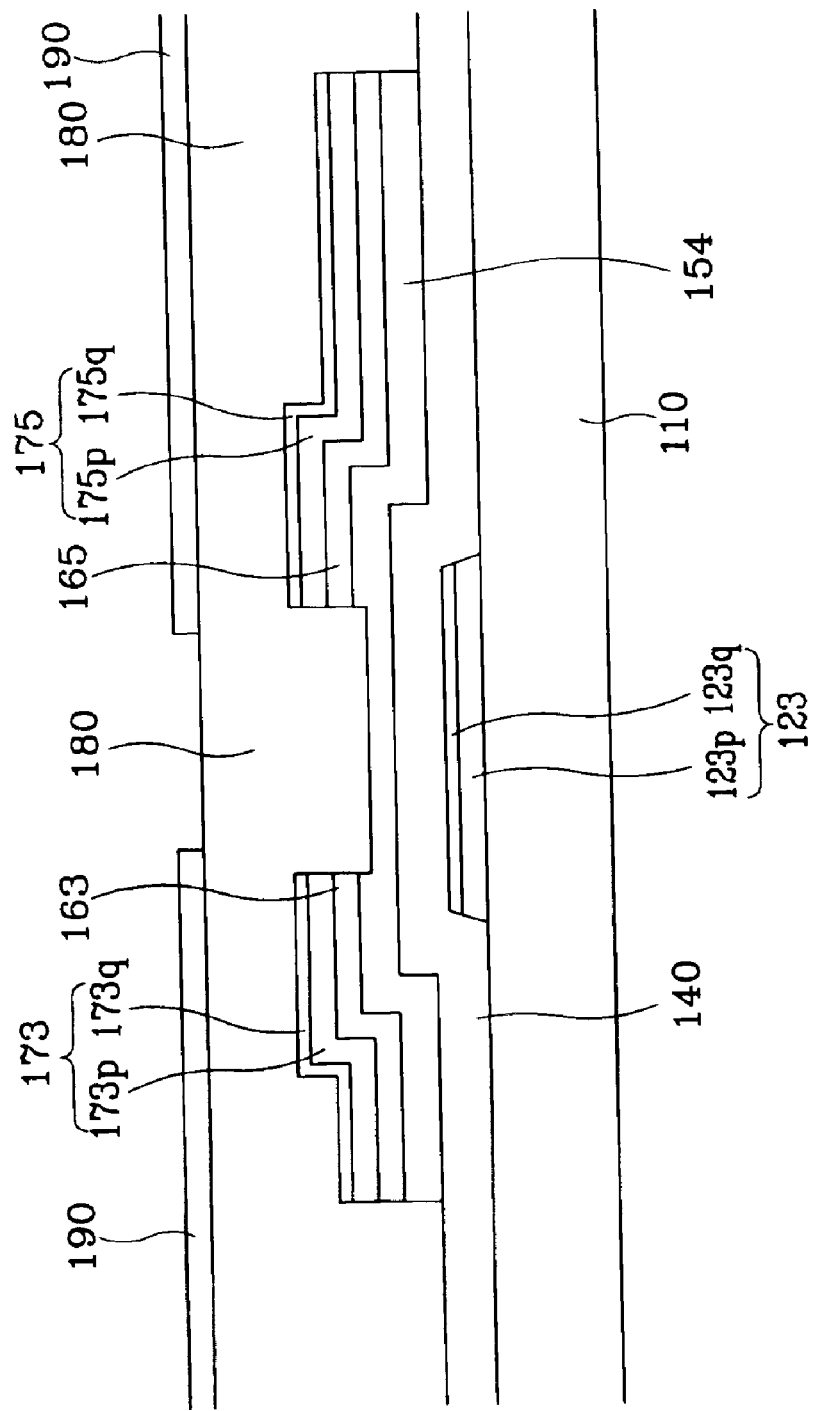
Figure 12:
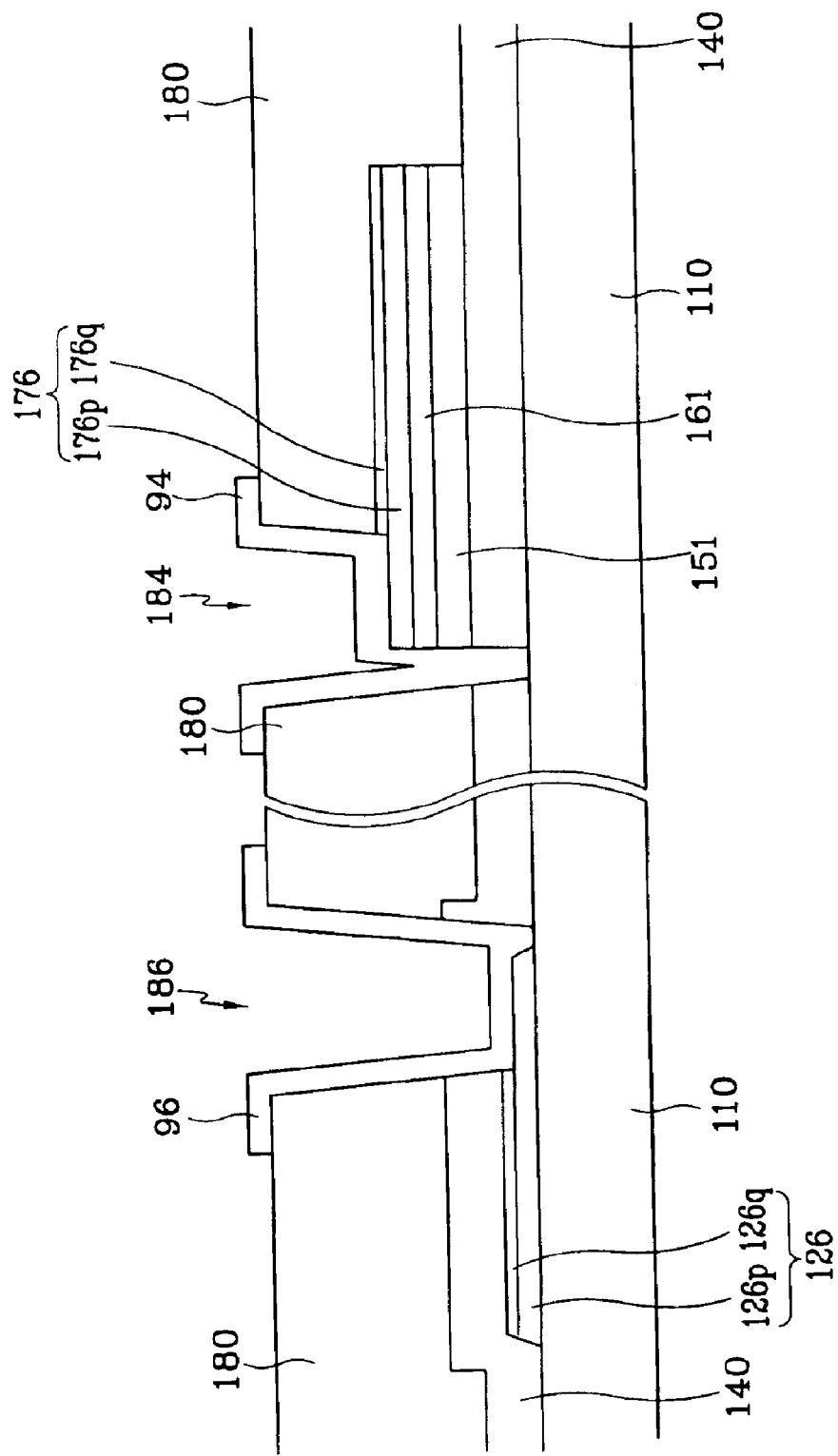

FIG. 9 is a layout view of an exemplary TFT array panel for an LCD according to another embodiment of the present invention, and FIGS. 10–12 are sectional views of the TFT array panel shown in FIG. 9 taken along the lines X–X', XI–XI' and XII–XII', respectively.

As shown in FIGS. 9–12, a layered structure of a TFT array panel of an LCD according to this embodiment is almost the same as that shown in FIGS. 2–4. That is, a plurality of gate lines 121 including a plurality of gate electrodes 123, etc. and a gate shorting bar 128 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a data shorting bar 178 are formed on the ohmic contacts 161 and 165, and a passivation layer 180 is formed thereon. A plurality of contact holes 182, 184, 185, 186 and 189 are provided at the passivation layer 180 and/or the gate insulating layer 140, and a plurality of pixel electrodes 190, a plurality of contact assistants 92 and 97, and a plurality of protection members 94 and 96 are formed on the passivation layer 180.

Different from the TFT array panel shown in FIGS. 2–4, the TFT array panel according to this embodiment provides a plurality of storage electrode lines 131 on the same layer as the gate lines 121 without expansions of the gate lines 121. The storage electrode lines 131 are electrically separated from the gate lines 121 and include a plurality of expansions 137. In addition, the drain electrodes 175 extend to overlap the expansions 137 of the storage electrode lines 131 to form storage capacitors without separate storage capacitor conductors. The storage electrode lines 131 include, like the gate lines 121, a lower film and an upper film, and the lower and upper films of the expansions 137 are indicated by 137p and 137q. The storage electrode lines 131 are supplied with a predetermined voltage such as the common voltage. The storage electrode lines 131 may be omitted if the storage capacitance generated by the overlapping of the gate lines 121 and the pixel electrodes 190 is sufficient.

The TFT array panel further includes a semiconductor stripe (not shown) and an ohmic contact stripe (not shown) located under the data shorting bar 178.

The semiconductor stripes 151 have almost the same planar shapes as the data lines 171, the drain electrodes 175, and the data shorting bar 178 as well as the underlying ohmic contacts 161, 165 and 167, except for the projections 154 where TFTs are provided. In particular, the semiconductor stripes 151 include some exposed portions, which are not covered with the data lines 171 and the drain electrodes 175, such as portions located between the source electrodes 173 and the drain electrodes 175.

Now, a method of manufacturing the TFT array panel shown in FIGS. 9–12 according to an embodiment of the present invention will be described in detail with reference to FIGS. 13A–19D as well as FIGS. 9–12.

Figure 13A:
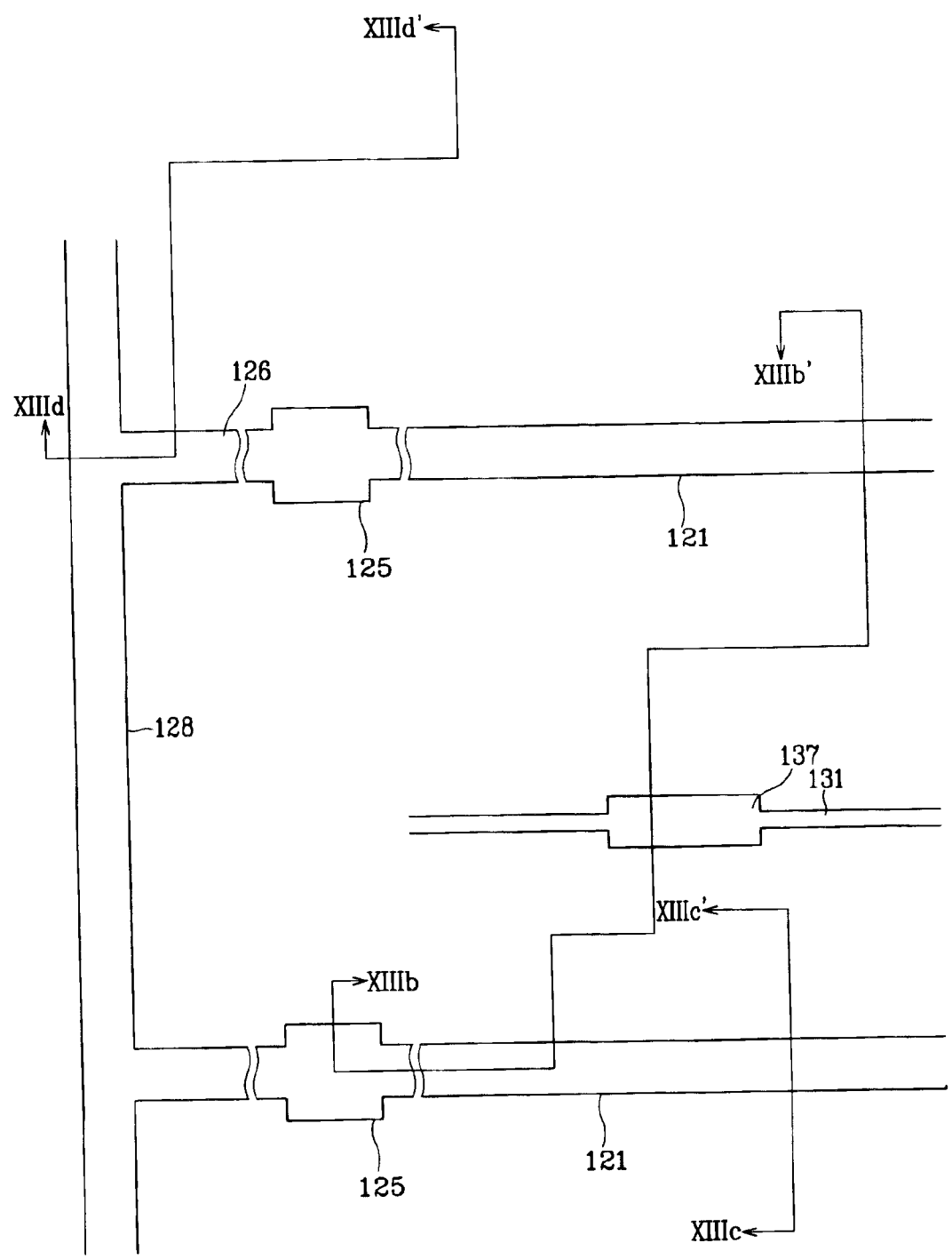
FIG. 13A is a layout view of a TFT array panel shown in FIGS. 9–12 in the first step of a manufacturing method thereof according to an embodiment of the present invention.
Figure 14A:
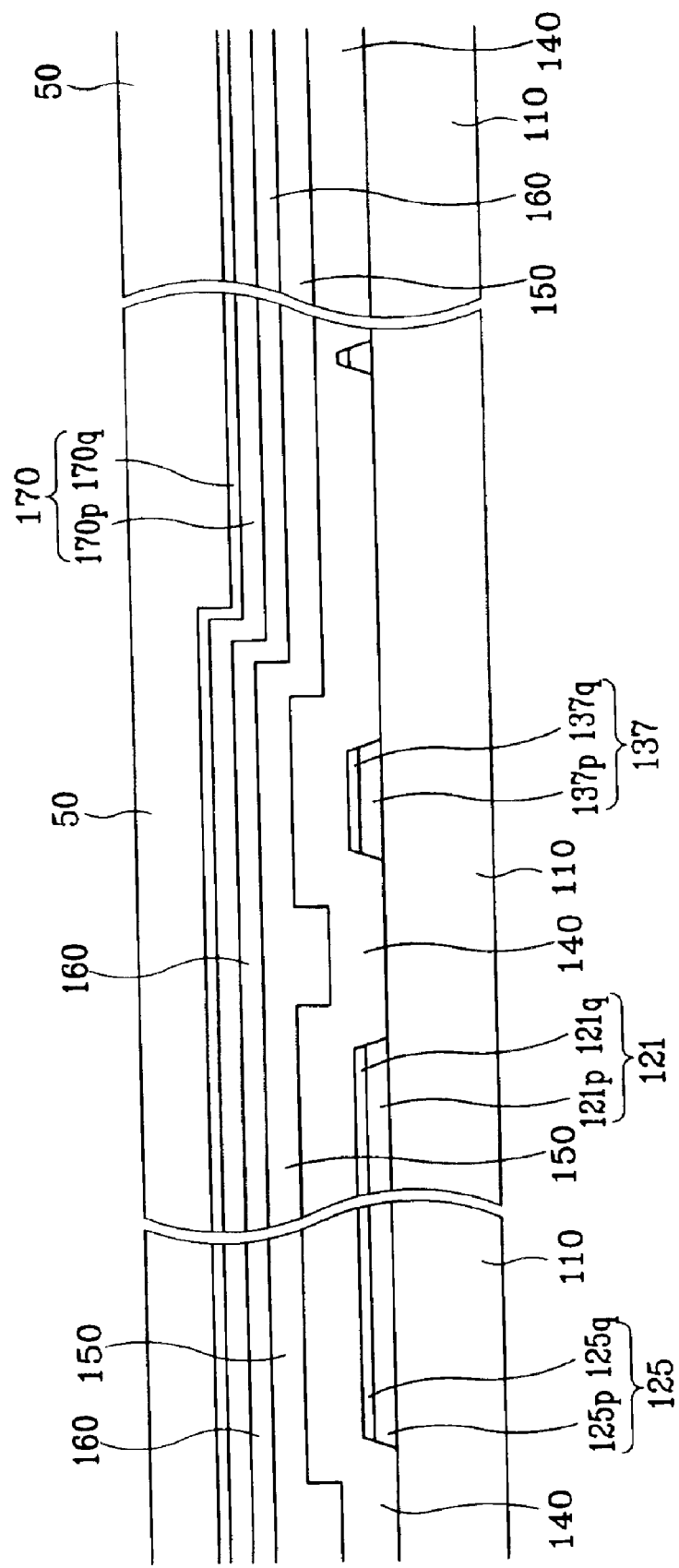
Figure 14C:
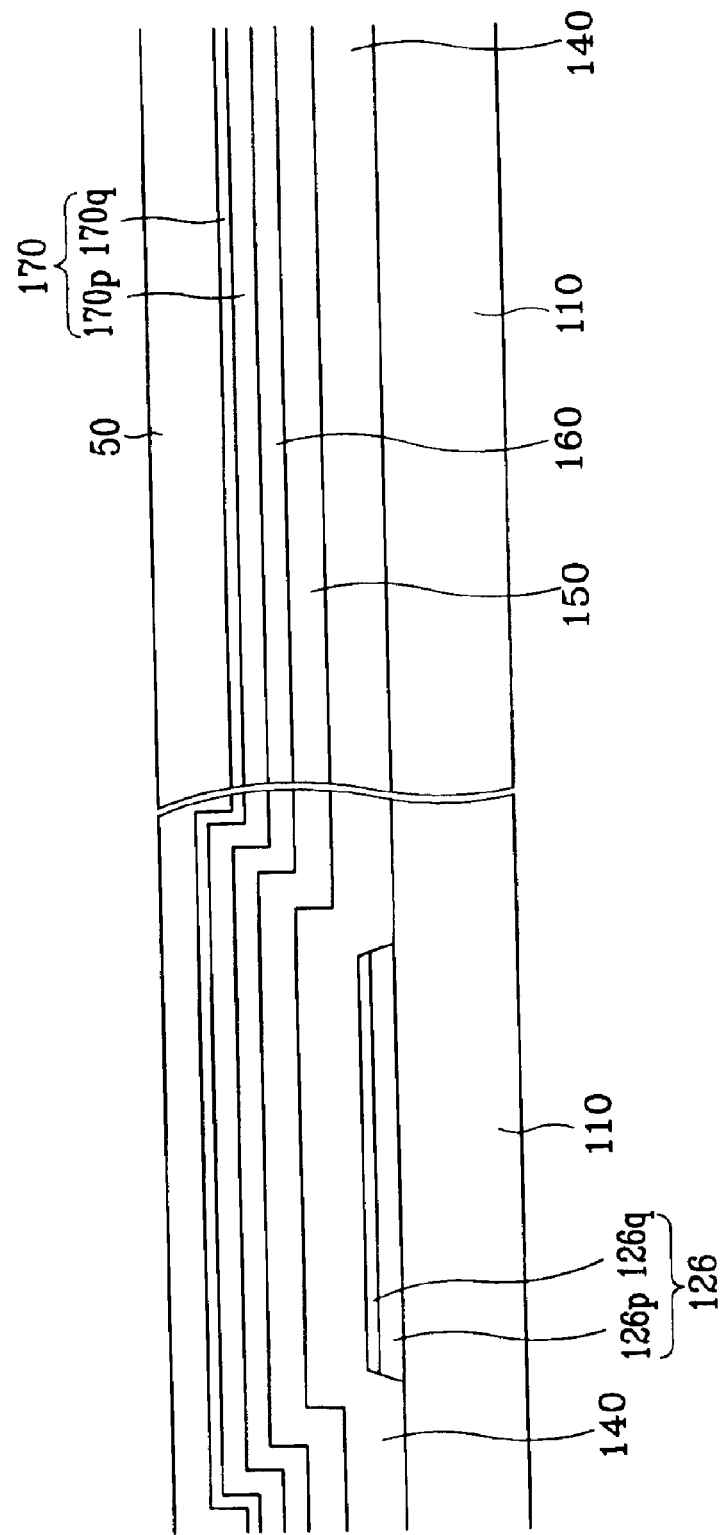
Figure 15A:
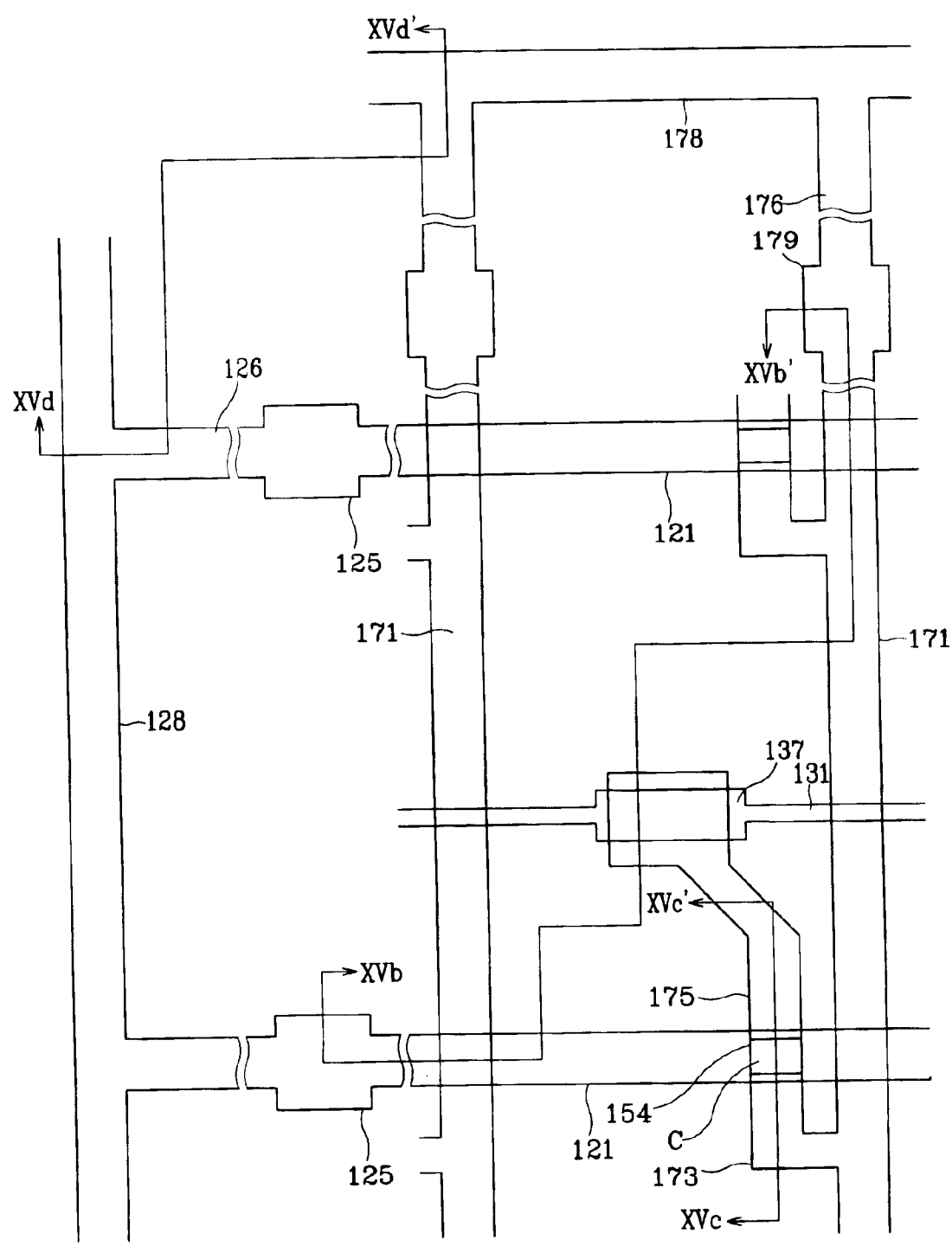
FIG. 15A is a layout view of the TFT array panel in the step following the step shown in FIGS. 14A–14C.
Figure 15B:
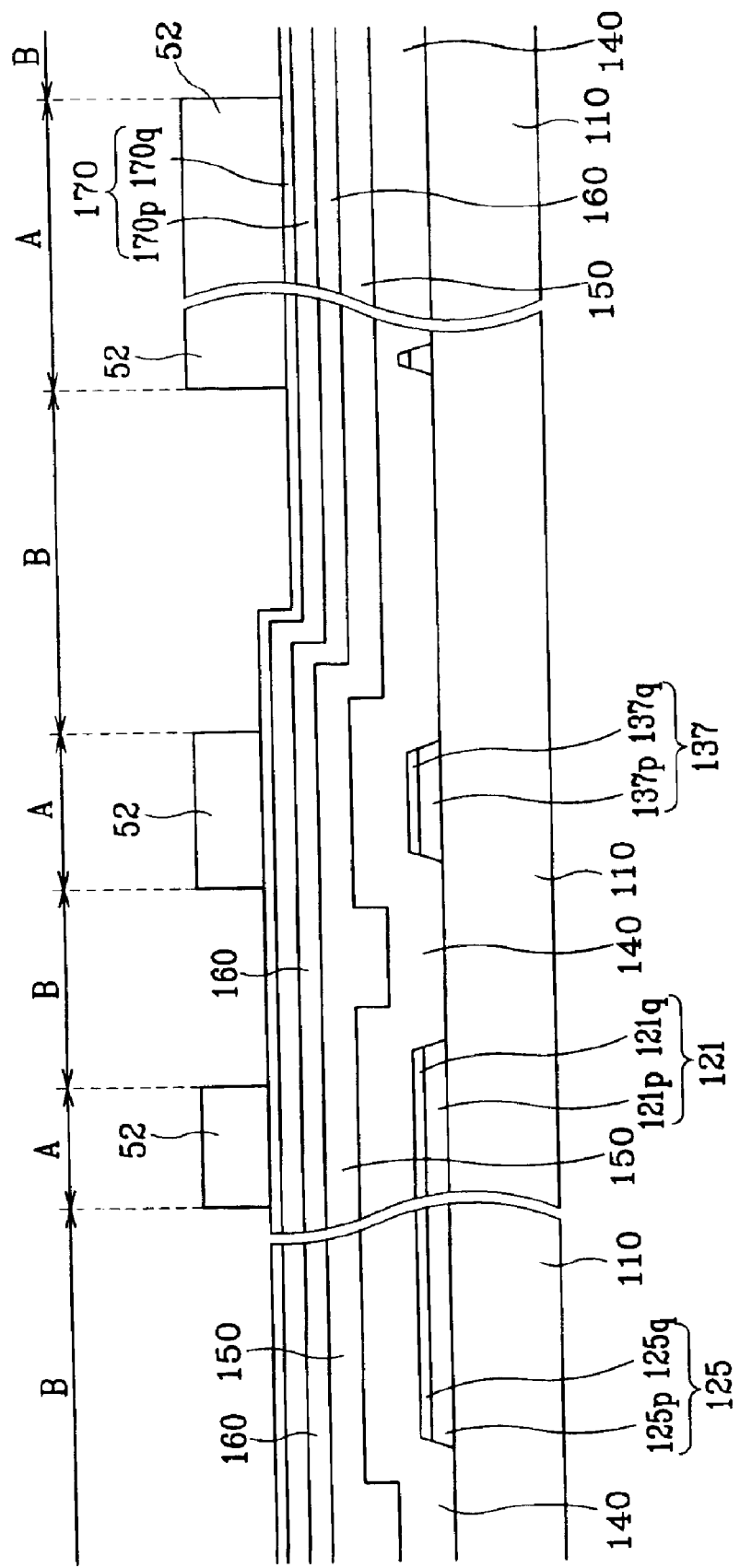
Figure 15D:
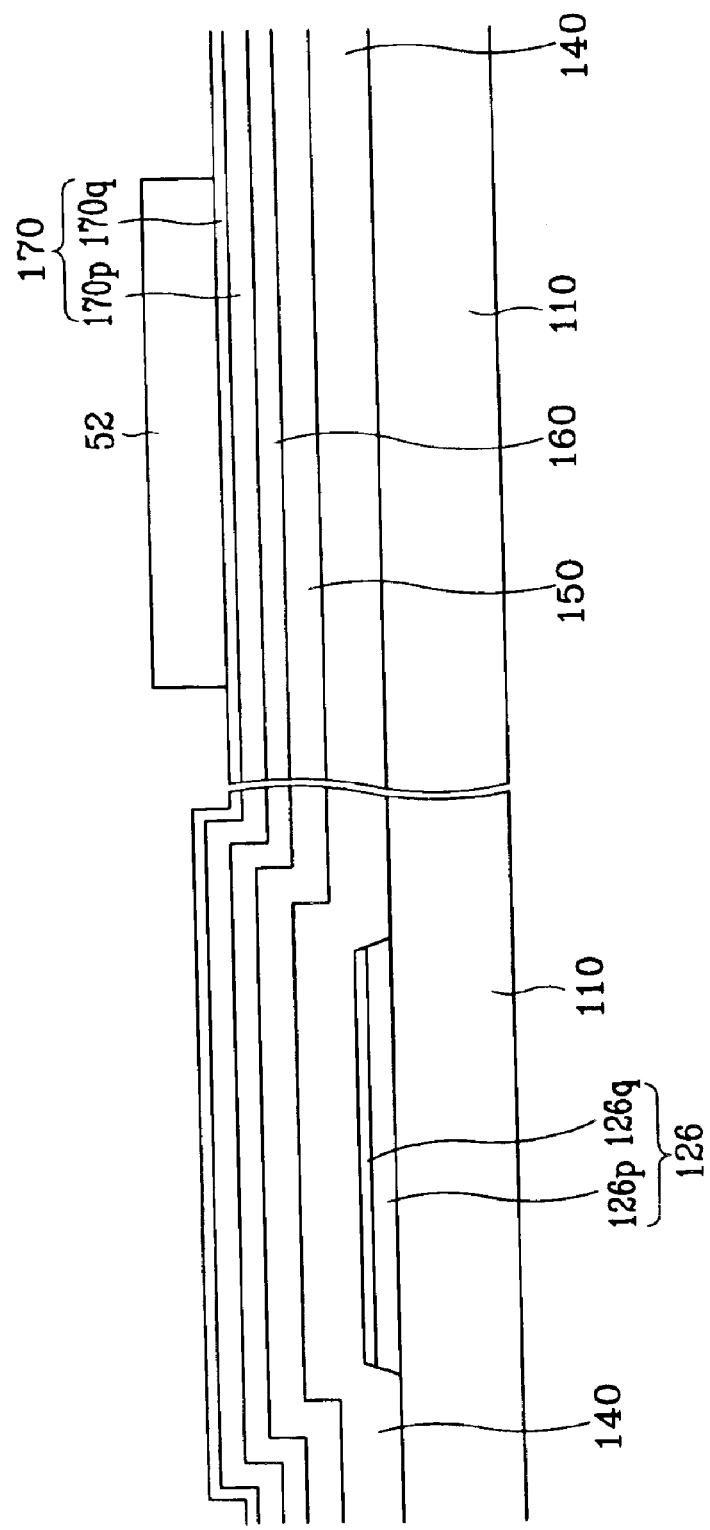

FIG. 13A is a layout view of a TFT array panel shown in FIGS. 9–12 in the first step of a manufacturing method thereof according to an embodiment of the present invention; FIGS. 13B–13D are sectional views of the TFT array panel shown in FIG. 13A taken along the lines XIIIB–XIIIB', XIIIC–XIIIC' and XIIID–XIIID', respectively; FIGS. 14A–14C are sectional views of the TFT array panel shown in FIG. 13A taken along the lines XIIIB–XIIIB', XIIIC–XIIIC' and XIIID–XIIID', respectively, and illustrate the step following the step shown in FIGS. 13B–13D; FIG. 15A is a layout view of the TFT array panel in the step following the step shown in FIGS. 14A–14C; FIGS. 15B–15D are sectional views of the TFT array panel shown in FIG. 15A taken along the lines XVB–XVB', XVC–XVC' and XVD–XVD', respectively; FIGS. 16A, 17A and 18A, FIGS. 16B, 17B and 18B, and FIGS. 16C, 17C and 18C are respective sectional views of the TFT array panel shown in FIG. 15A taken along the lines XVB–XVB', XVC–XVC' and XVD–XVD', respectively, and illustrate the steps following the step shown in FIGS. 15B–15D; FIG. 19A is a layout view of a TFT array panel in the step following the step shown in FIGS. 18A–18C; and FIGS. 19B–19D are sectional views of the TFT array panel shown in FIG. 19A taken along the lines XIXB–XIXB', XIXC–XIXC' and XIXD–XIXD', respectively.

Referring to FIGS. 13A–13D, a plurality of gate lines 121 including a plurality of gate electrodes 123, etc., a plurality of storage electrode lines 131 including a plurality of expansions 137, and a gate shorting bar 128 are formed on a substrate 110 by photo etching. The gate lines 121, the storage electrode lines 131, and the gate shorting bar 128 include lower and upper films.

As shown in FIGS. 14A–14C, a gate insulating layer 140, an intrinsic a-Si layer 150, and an extrinsic a-Si layer 160 are sequentially deposited by CVD such that the layers 140, 150 and 160 bear thickness of about 1,500–5,000 Å, about 500–2,000 Å and about 300–600 Å, respectively. A conductive layer 170 including a lower film 170p and an upper film 170q and having a thickness of about 1,500–3,000 Å is deposited by sputtering, and a photoresist film 50 with the thickness of about 1–2 microns is coated on the conductive layer 170.

The photoresist film 50 is exposed to light through an exposure mask (not shown), and developed such that the developed photoresist has a position dependent thickness. The photoresist shown in FIGS. 15B–15D includes a plurality of first to third portions with decreased thickness. The first portions 52 located on wire areas A and the second portions 54 located on channel areas C are indicated by reference numerals 52 and 54, respectively, and no reference numeral is assigned to the third portions located on remaining areas B since they have substantially zero thickness to expose underlying portions of the conductive layer 170. The thickness ratio of the second portions 54 to the first portions 52 is adjusted depending upon the process conditions in the subsequent process steps. It is preferable that the thickness of the second portions 54 is equal to or less than half of the thickness of the first portions 52, and in particular, equal to or less than 4,000 Å.

The position-dependent thickness of the photoresist is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist film 52 and 54 enables to selectively etch the underlying layers when using suitable process conditions. Therefore, a plurality of data lines 171 including a plurality of source electrodes 173, a plurality of drain electrodes 175, and a data shorting bar 178 as well as a plurality of ohmic contact stripes 161 including a plurality of projections 163, a plurality of ohmic contact islands 165, and a plurality of semiconductor stripes 151 including a plurality of projections 154 are obtained by a series of etching steps.

For descriptive purpose, portions of the conductive layer 170, the extrinsic a-Si layer 160, and the intrinsic a-Si layer 150 on the wire areas A are called first portions, portions of the conductive layer 170, the extrinsic a-Si layer 160, and the intrinsic a-Si layer 150 on the channel areas C are called second portions, and portions of the conductive layer 170, the extrinsic a-Si layer 160, and the intrinsic a-Si layer 150 on the remaining areas B are called third portions.

An exemplary sequence of forming such a structure is as follows:

(1) Removal of third portions of the conductive layer 170, the extrinsic a-Si layer 160 and the intrinsic a-Si layer 150 on the wire areas A;

(2) Removal of the second portions 54 of the photoresist;

(3) Removal of the second portions of the conductive layer 170 and the extrinsic a-Si layer 160 on the channel areas C; and (4) Removal of the first portions 52 of the photoresist.

Another exemplary sequence is as follows:

(1) Removal of the third portions of the conductive layer 170;

(2) Removal of the second portions 54 of the photoresist;

(3) Removal of the third portions of the extrinsic a-Si layer 160 and the intrinsic a-Si layer 150;

(4) Removal of the second portions of the conductive layer 170;

(5) Removal of the first portions 52 of the photoresist; and (6) Removal of the second portions of the extrinsic a-Si layer 160.

The first example is described in detail.

Figure 16B:
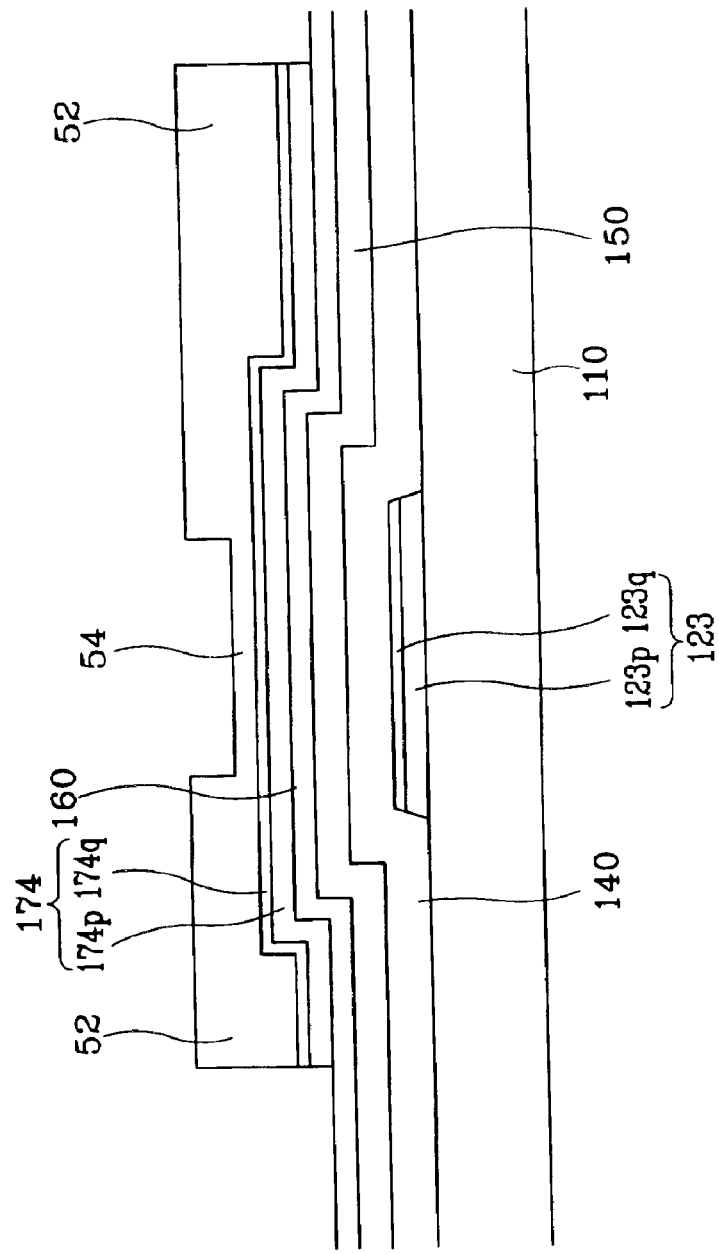

As shown in FIGS. 16A–16C, the exposed third portions of the conductive layer 170 on the areas B are removed out by wet etching or dry etching to expose the underlying third portions of the extrinsic a-Si layer 160.

Reference numeral 174 indicates a remaining portion of the conductive layer 170 including the data shorting bar 178, the data lines 171 and the drain electrodes 175 connected to each other. The dry etching may etch out the top portions of the photoresist 52 and 54.

Figure 17A:
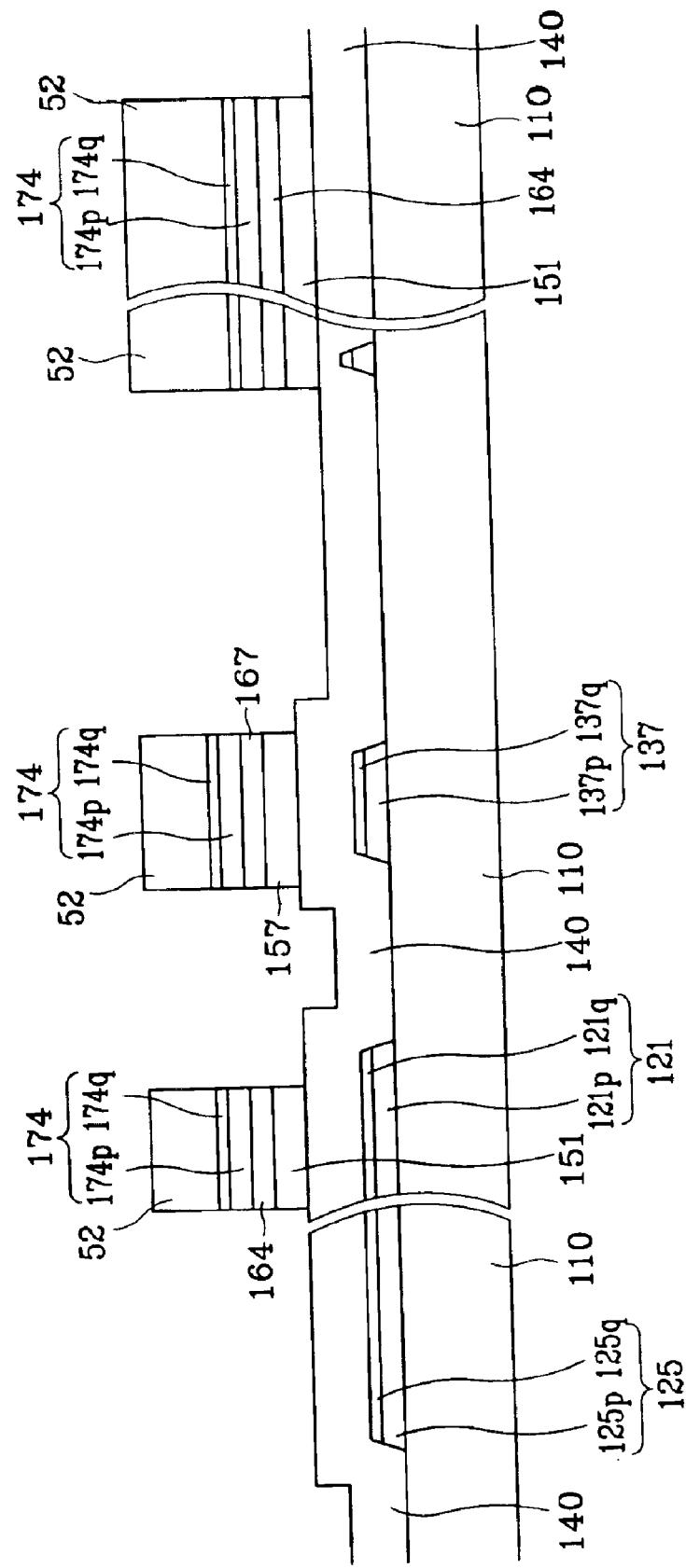
Figure 17B:
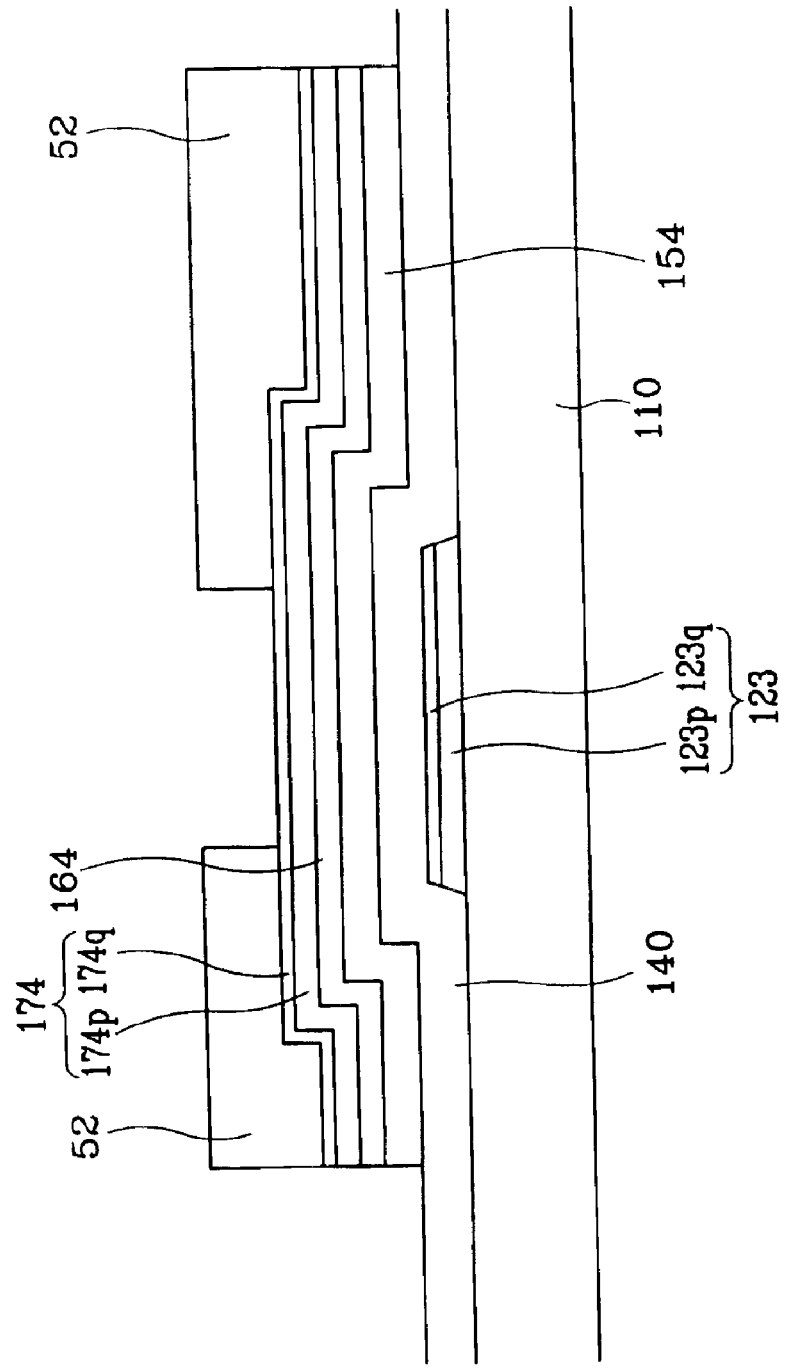
Figure 17C:
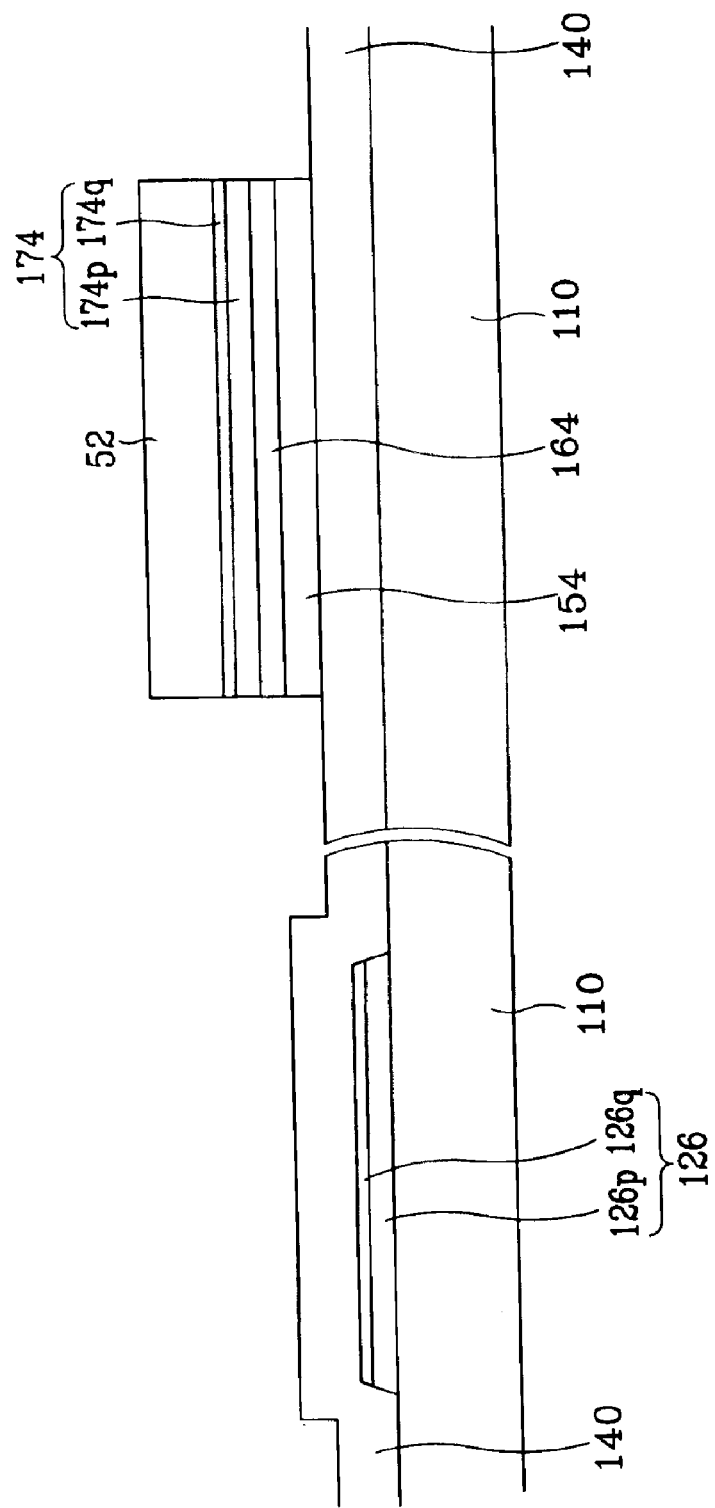

Referring to FIGS. 17A–17C, the third portions of the extrinsic a-Si layer 160 and of the intrinsic a-Si layer 150 on the areas B are removed preferably by dry etching and the second portions 54 of the photoresist are removed to expose the second portions of the conductor 174. The removal of the second portions 54 of the photoresist are performed either simultaneously with or independent from the removal of the third portions of the extrinsic a-Si layer 160 and of the intrinsic a-Si layer 150. The etched thicknesses of the photoresist 52 and 54 and the intrinsic a-Si layer 150 (or the extrinsic a-Si layer 160) are nearly the same when using a gas mixture of SF6 and HCl, or a gas mixture of SF6 and O2. The dry etching may thin the first portions 52 of the photoresist.

Residue of the second portions 54 of the photoresist remained on the channel areas C is removed by ashing.

The semiconductor stripes 151 are completed in this step, and reference numeral 164 indicates remaining portions of the extrinsic a-Si layer 160 including the ohmic contact stripes and islands 161 and 165 connected to each other, which are called "extrinsic semiconductor stripes."

Figure 18A:
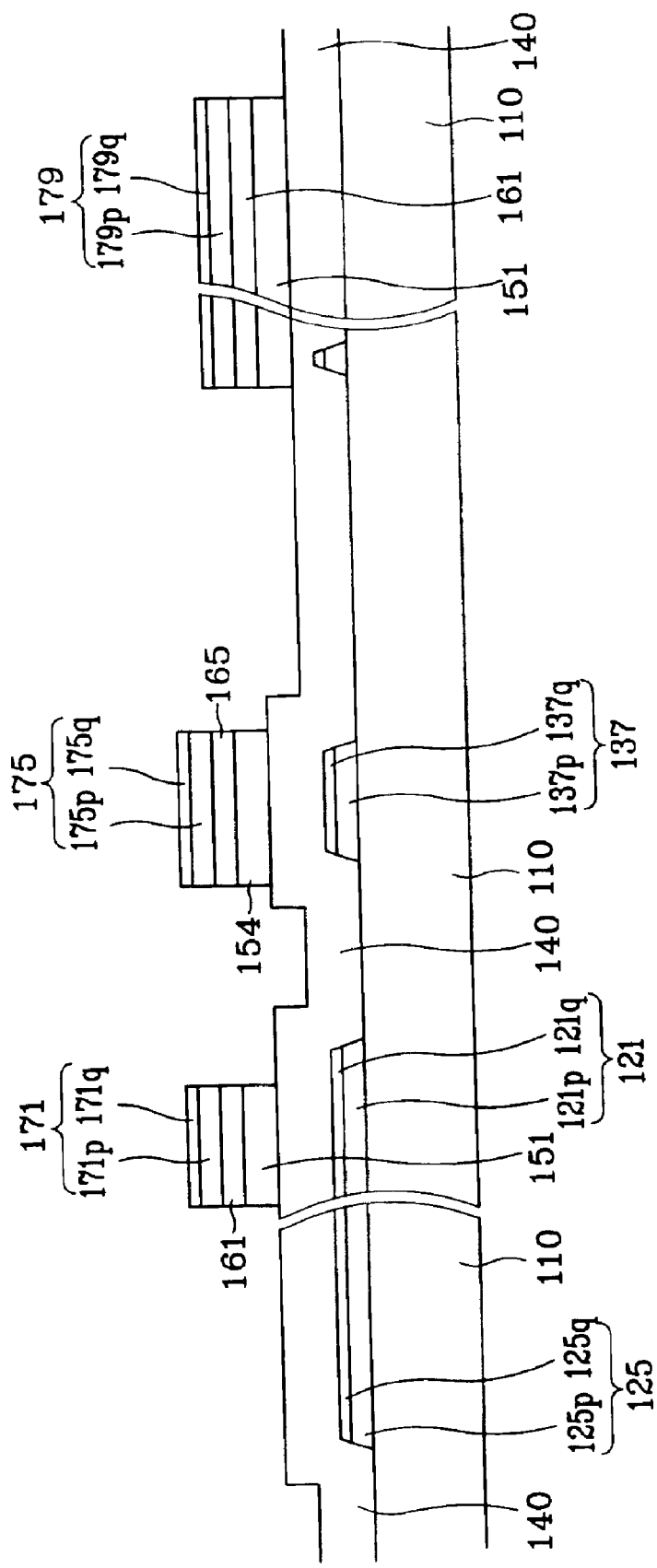
Figure 18B:
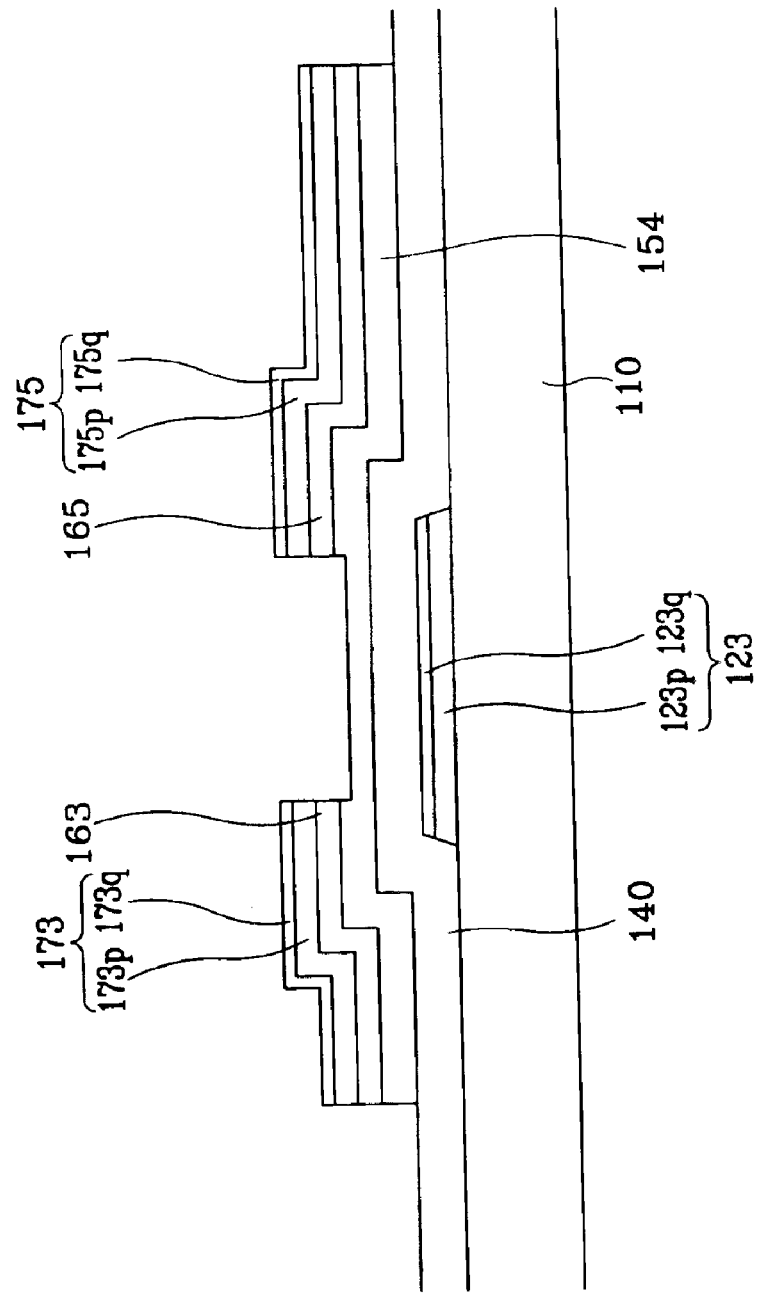
Figure 18C:
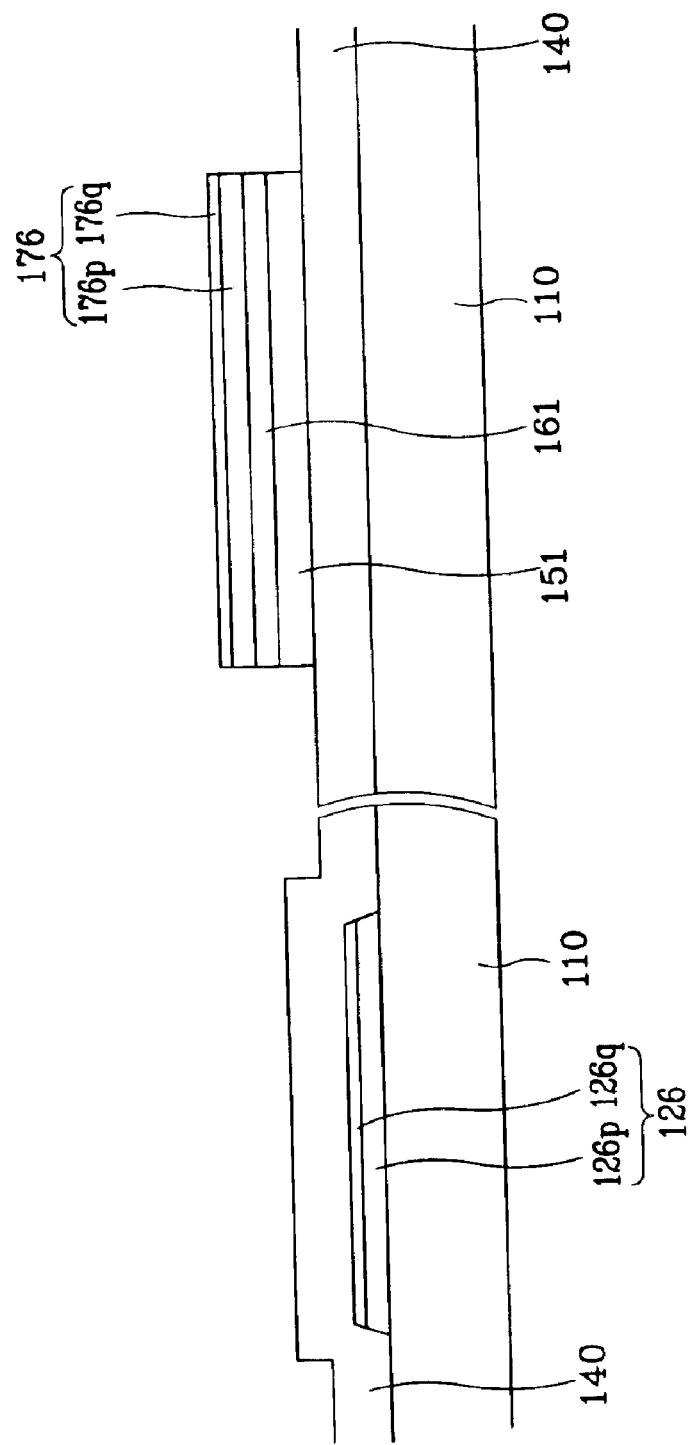
Figure 19A:
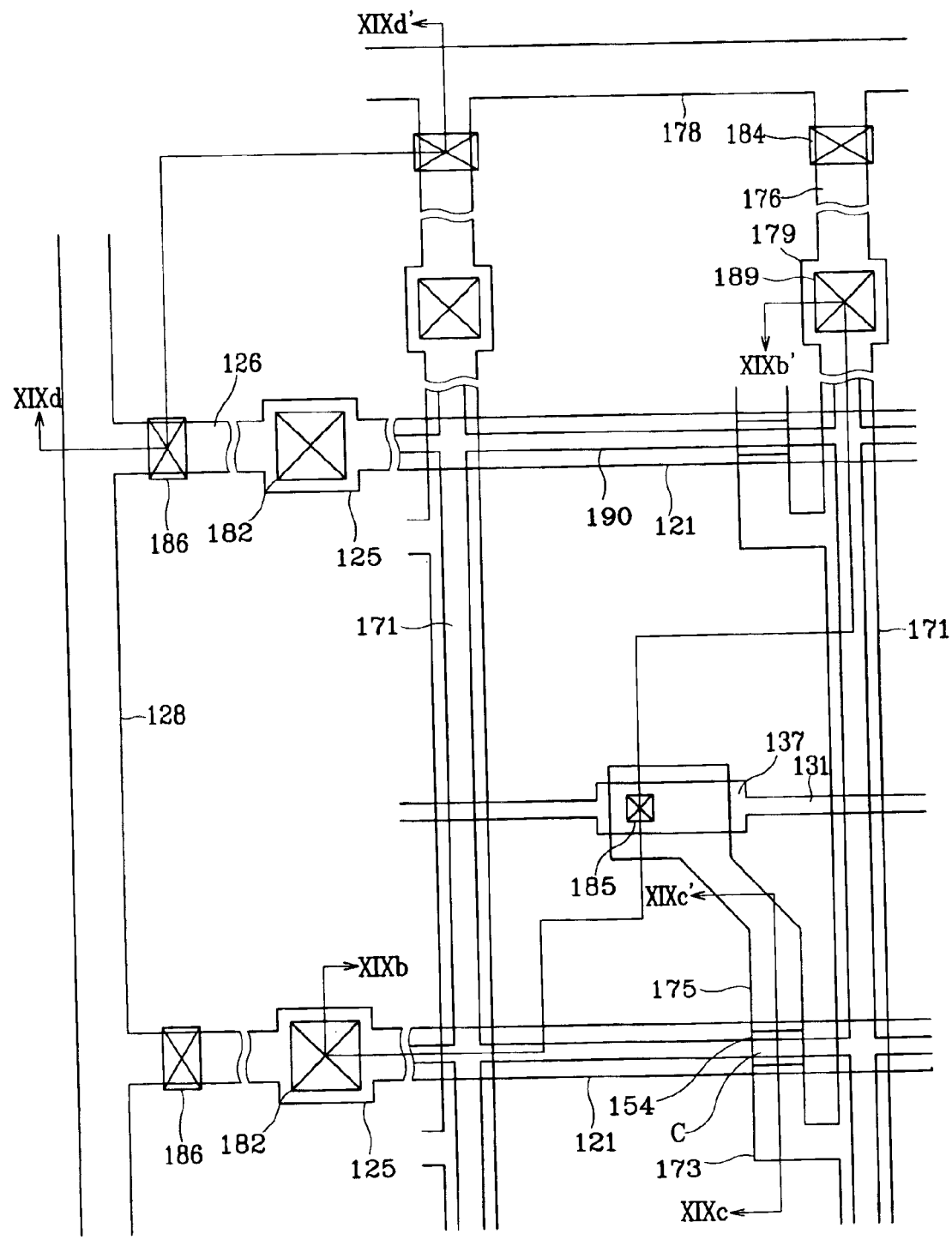
FIG. 19A is a layout view of a TFT array panel in the step following the step shown in FIGS. 18A–18C.
Figure 19B:
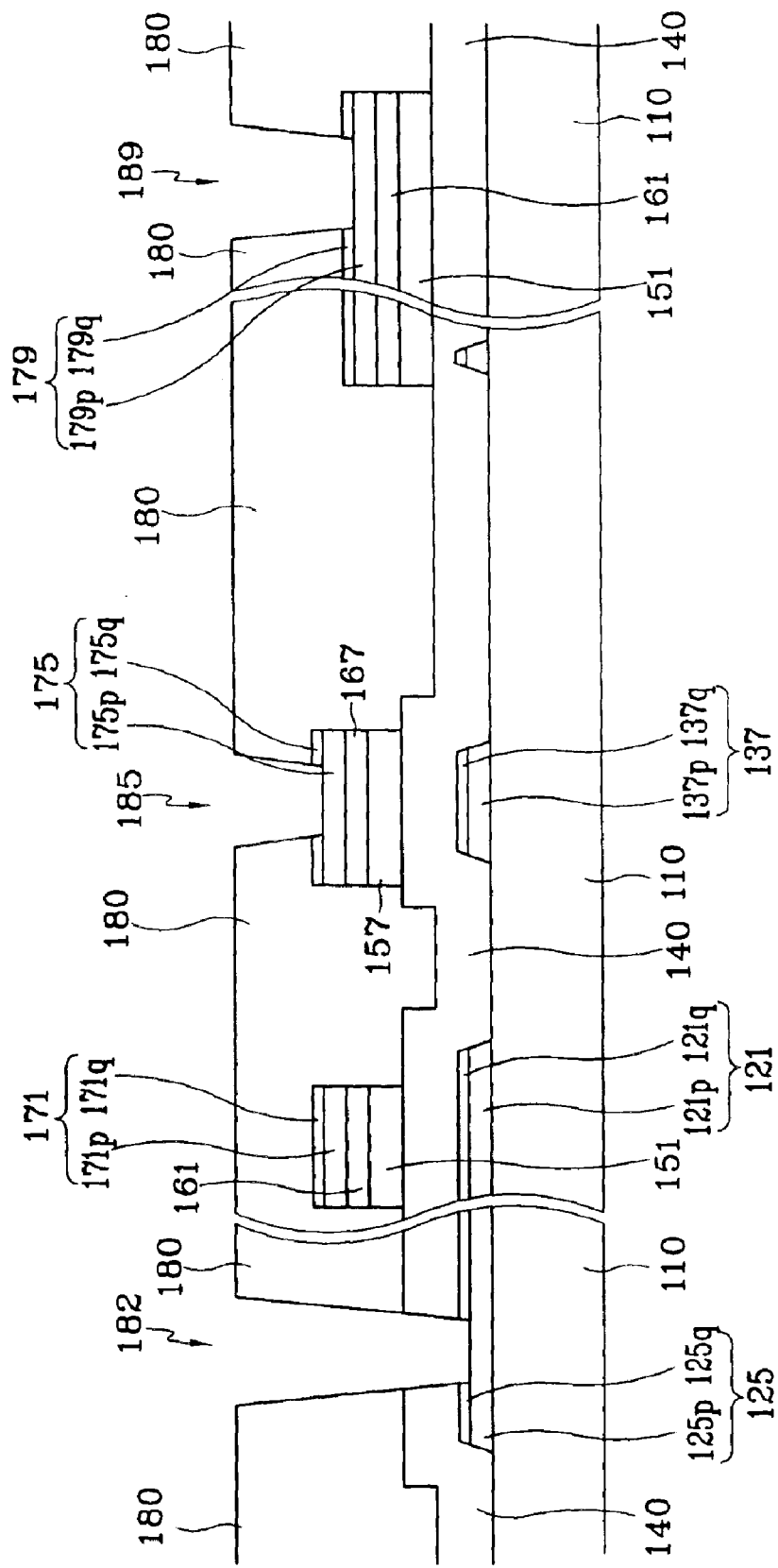
Figure 19D:
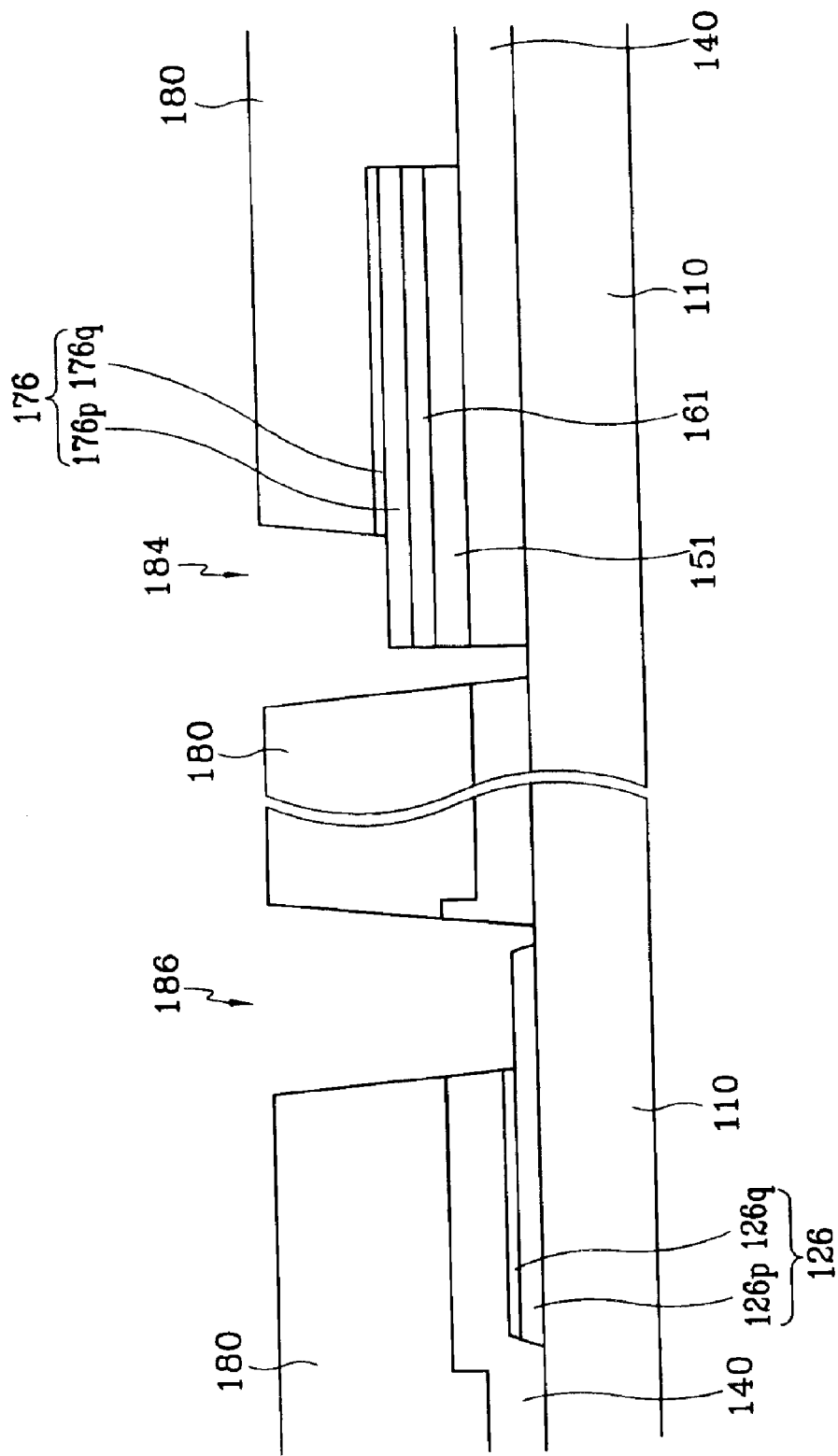

As shown in FIGS. 18A–18C, the second portions of the conductor 174 and of the extrinsic a-Si stripes 164 on the channel areas C as well as the first portions 52 of the photoresist are removed.

As shown in FIG. 18B, top portions of the projections 154 of the intrinsic semiconductor stripes 151 on the channel areas C may be removed to cause thickness reduction, and the first portions 52 of the photoresist are etched to a predetermined thickness.

The dry etching can be applied to both the conductor 174 and the extrinsic a-Si stripes 164, or the wet etching is applied to the conductor 174 while the dry etching is applied to the extrinsic a-Si stripes 164. Examples of etching gases used for etching the extrinsic a-Si layer 160 and the intrinsic a-Si layer 150 are a gas mixture of $CF_4$ and HCl and a gas mixture of $CF_4$ and $O_2$. Use of the gas mixture of $CF_4$ and $O_2$ enables to obtain uniform thickness of etched portions of the semiconductor layer 150.

In this way, the conductor 174 is divided into a plurality of data lines 171 and a data shorting bar 178 connected to the data lines 171 and a plurality of drain electrodes 175 to be completed, and the extrinsic semiconductor stripes 164 are divided into a plurality of ohmic contact stripes 161 and a plurality of ohmic contact islands 165 to be completed.

Next, a passivation layer 180 is formed by chemical-vapor-depositing silicon nitride at a temperature in a range of about 250–1500° C., by growing low dielectric material such as a-Si:C:O or a-Si:O:F, by CVD of silicon nitride, or by coating an organic insulating material such as acryl-based material having a good planarization characteristic. Referring to FIGS. 19A–19D, the passivation layer 180 as well as the gate insulating layer 140 is photo-etched to form a plurality of contact holes 182, 184, 185, 186 and 189 exposing portions of the upper films 125q, 176q, 175q, 126q and 179q of the connecting portions 125 of the gate lines 121, the extensions 176 of the data lines 176, the drain electrodes 175, the extensions 126 of the gate lines 121, and the connecting portions 179 of the data lines 171, respectively.

Thereafter, the exposed portions of the upper films 125q, 176q, 175q, 126q and 179q are removed by blanket etching with an Al etchant.

Finally, as shown in FIGS. 9–12, an ITO or IZO layer with a thickness in a range between about 500 Å and about 1,000 Å is sputtered and photo-etched to form a plurality of pixel electrodes 190, a plurality of contact assistants 92 and 97, and a plurality of protection members 94 and 96.

This embodiment simplifies the manufacturing process by forming the data lines 171, the drain electrodes 175, and the data shorting bar 178 as well as the ohmic contacts 161 and 165 and the semiconductor stripes 151 using a single photolithography step.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   a plurality of gate lines formed on an insulating substrate;
   a gate insulating layer formed on the gate lines;
   a semiconductor layer formed on the gate insulating layer;
   a plurality of data lines formed at least in part on the semiconductor layer;
   a plurality of drain electrodes formed at least in part on the semiconductor layer;
   a plurality of pixel electrodes connected to the drain electrodes; and
   a plurality of conductive lines, each conductive line connected to one of the gate lines and the data lines and including first and second portions having different resistances.

2. The thin film transistor array panel of claim 1, wherein each conductive line includes a lower film and an upper film having resistivity lower than the lower film and the first portion of each conductive line does not include the upper film.

3. The thin film transistor array panel of claim 2, further comprising a passivation layer disposed between the data lines and the pixel electrodes.

4. The thin film transistor array panel of claim 3, wherein the passivation layer has a plurality of first contact holes exposing the first portions of the conductive lines.

5. The thin film transistor array panel of claim 4, wherein the first contact holes expose edges of the first portions of the conductive lines.

6. The thin film transistor array panel of claim 4, wherein the passivation layer further has a plurality of second and third contact holes exposing portions of the gate lines and the data lines, respectively.

7. The thin film transistor array panel of claim 6, further comprising a plurality of contact assistants formed of the same layer as the pixel electrodes and connected to the gate lines and the data lines through the second and the third contact holes, respectively.

8. The thin film transistor array panel of claim 4, further comprising a plurality of protective members formed of the same layer as the pixel electrodes and covering the first portions of the conductive lines.

9. The thin film transistor array panel of claim 1, further comprising a plurality of ohmic contacts disposed between the semiconductor layer and the data lines.

10. The thin film transistor array panel of claim 1, wherein the semiconductor layer has substantially the same planar shape as the data lines and the drain electrodes except for portions located between the data lines and the drain electrodes.

11. The thin film transistor array panel of claim 1, further comprising a shorting bar connected to the conductive lines.

12. The thin film transistor array panel of claim 1, wherein the conductive lines extend to an edge of the thin film transistor array panel.

* * * * *